(12) United States Patent
Kurogi

(10) Patent No.: US 8,614,494 B2
(45) Date of Patent: Dec. 24, 2013

(54) SOLID-STATE IMAGING DEVICE, MANUFACTURING METHOD OF THE SAME AND ELECTRONIC APPARATUS

(75) Inventor: Syogo Kurogi, Fukuoka (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/410,911

(22) Filed: Mar. 2, 2012

(65) Prior Publication Data

US 2012/0241895 A1 Sep. 27, 2012

(30) Foreign Application Priority Data

Mar. 25, 2011 (JP) ................................. 2011-067076

(51) Int. Cl.
*H01L 21/02* (2006.01)
(52) U.S. Cl.
USPC ........... 257/437; 257/291; 257/294; 257/435; 257/436
(58) Field of Classification Search
CPC ................................................. H01L 27/1464
USPC ................................................. 257/291, 294
See application file for complete search history.

(56) References Cited

U.S. PATENT DOCUMENTS

| 2008/0135963 | A1* | 6/2008 | Akiyama ....................... 257/432 |
| 2010/0110271 | A1* | 5/2010 | Yanagita et al. ............... 348/340 |
| 2011/0049492 | A1* | 3/2011 | Sawaki et al. .................... 257/40 |
| 2011/0220976 | A1* | 9/2011 | Iida et al. ....................... 257/291 |

FOREIGN PATENT DOCUMENTS

| JP | 2007-258684 | 10/2007 |
| JP | 2010-109295 | 5/2010 |
| JP | 2010-186818 | 8/2010 |

* cited by examiner

*Primary Examiner* — Ha Tran T Nguyen
*Assistant Examiner* — Paul Noel
(74) *Attorney, Agent, or Firm* — Rader, Fishman & Grauer PLLC

(57) ABSTRACT

Disclosed herein is a solid-state imaging device including: an opto-electrical conversion section provided inside a semiconductor substrate to receive incident light coming from one surface of the semiconductor substrate; a wiring layer provided on the other surface of the semiconductor substrate; and a light absorption layer provided between the other surface of the semiconductor substrate and the wiring layer to absorb transmitted light passing through the opto-electrical conversion section as part of the incident light.

10 Claims, 13 Drawing Sheets

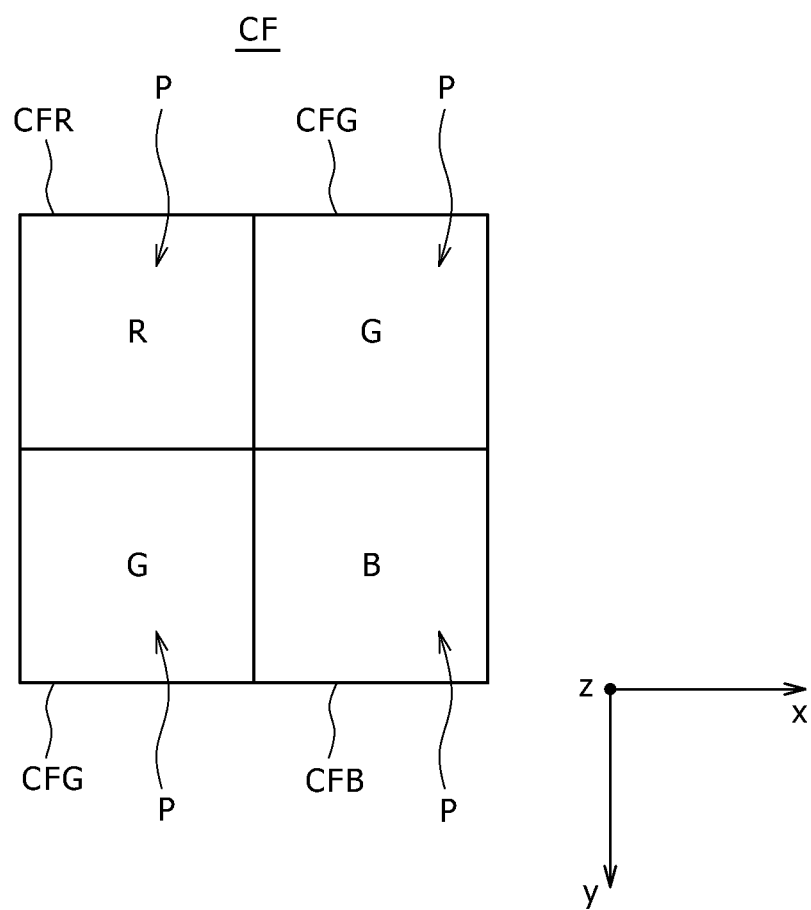

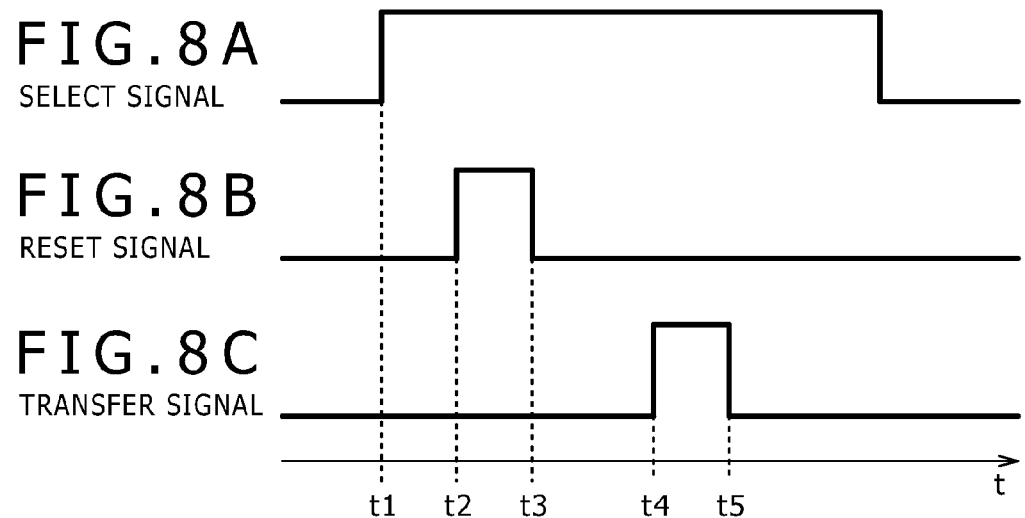

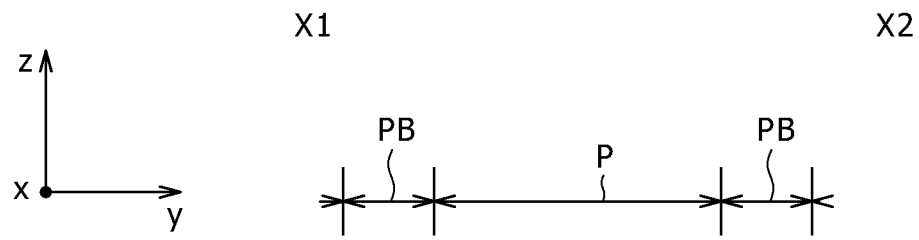
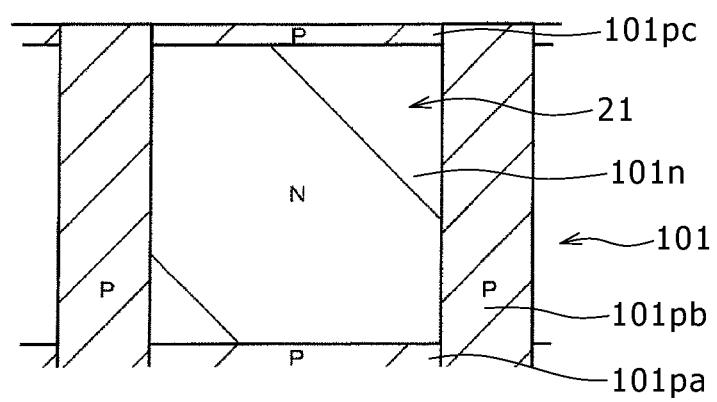
FIG. 9A
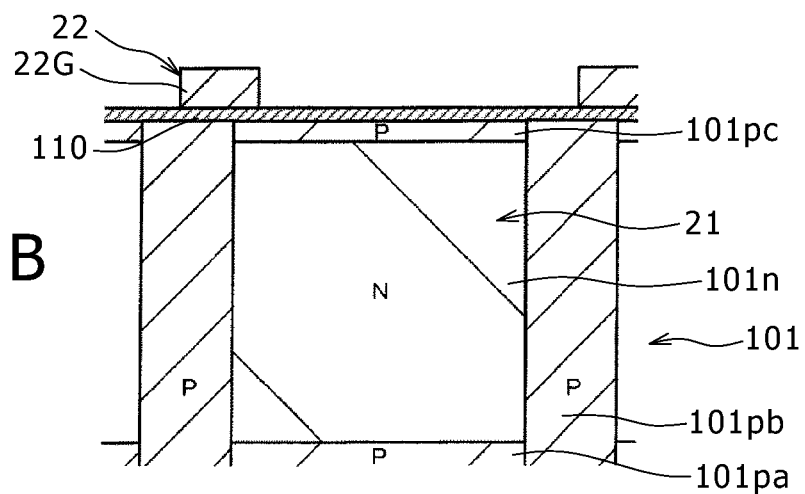
FIG. 9B

SOLID-STATE IMAGING DEVICE, MANUFACTURING METHOD OF THE SAME AND ELECTRONIC APPARATUS

BACKGROUND

The present disclosure relates to a solid-state imaging device, its manufacturing method and electronic apparatus each making use of the solid-state imaging device.

An electronic apparatus such as a digital camera employs a solid-state imaging device. For example, an electronic apparatus employs a CMOS (Complementary Metal Oxide Semiconductor) image sensor serving as the solid-state imaging device.

The solid-state imaging device includes a plurality of pixels laid out in a pixel area of a semiconductor substrate. Each of the pixels has an opto-electrical conversion section. A typical example of the opto-electrical conversion section is a photodiode in which incident light is received by a light receiving surface and subjected to an opto-electrical conversion process in order to convert the light into signal electric charge.

In a CMOS image sensor, which is a typical solid-state imaging device, each pixel is configured to include a pixel transistor circuit in addition to an opto-electrical conversion section. The pixel transistor circuit is configured to read out signal electric charge generated by the opto-electrical conversion section, and output the signal electric charge to a signal line as an electrical signal.

In a solid-state imaging device including a plurality of opto-electrical conversion sections laid out on a semiconductor substrate, in general, a multi-layer wiring layer is provided on the front-surface side of the semiconductor substrate and incident light coming from the front-surface side is received by the light receiving surface of the opto-electrical conversion section. A solid-state imaging device having such a configuration is referred to as a solid-state imaging device of the front-surface radiation type. Thus, in the case of the front-surface radiation type, the multi-layer wiring layer having a large thickness exists at a position between a micro-lens and the light receiving surface. In consequence, wires reduce the aperture ratio. As a result, it may be difficult to improve the sensitivity in some cases.

In order to solve the problem described above, there has been proposed a configuration in which incident light comes from the rear-surface side of the semiconductor substrate is received by the opto-electrical conversion section. The rear-surface side of the semiconductor substrate is a side opposite to the aforementioned front-surface side on which the multi-layer wiring layer is provided. A solid-state imaging device having such a configuration is referred to as a solid-state imaging device of the rear-surface radiation type. For more information on the rear-surface radiation type, the reader is advised to refer to documents such as Japanese Patent Laid-Open Nos. 2010-109295, 2010-186818 and 2007-258684.

In the case of the rear-surface radiation type, the thickness of the semiconductor substrate is reduced to a value of the order of 3 μm. In consequence, incident light passing through the semiconductor substrate may be reflected by the wires included in the multi-layer wiring layer and may propagate back to the photodiodes laid out on the semiconductor substrate in some cases. Thus, in such cases, a signal generated by a photodiode includes noises which reduce the quality of the taken image.

SUMMARY

As described above, it is difficult to improve the quality of an image taken by making use of the existing imaging device.

It is desirable to provide a solid-state imaging device capable of improving the quality of the taken image, a method for manufacturing the solid-state imaging device and an electronic apparatus employing the solid-state imaging device.

A solid-state imaging device provided by the present disclosure includes:

an opto-electrical conversion section provided inside a semiconductor substrate to receive incident light coming from one surface of the semiconductor substrate;

a wiring layer provided on the other surface of the semiconductor substrate; and a light absorption layer provided between the other surface of the semiconductor substrate and the wiring layer to absorb transmitted light passing through the opto-electrical conversion section as part of the incident light.

An electronic apparatus provided by the present disclosure employs the solid-state imaging device described above.

A method for manufacturing a solid-state imaging device provided by the present disclosure includes:

providing an opto-electrical conversion section inside a semiconductor substrate to serve as a section for receiving incident light coming from one surface of the semiconductor substrate;

providing a light absorption layer on the other surface of the semiconductor substrate to serve as a layer for absorbing transmitted light passing through the opto-electrical conversion section as part of the incident light; and providing a wiring layer so as to cover the other surface pertaining to the semiconductor substrate to serve as a surface on which the light absorption layer has been provided.

In accordance with the present disclosure, the light absorption layer provided between the other surface of the semiconductor substrate and the wiring layer absorbs transmitted light passing through the opto-electrical conversion section as part of the incident light.

In accordance with the present disclosure, it is possible to provide a solid-state imaging device capable of improving the quality of the taken image, a method for manufacturing the solid-state imaging device and an electronic apparatus employing the solid-state imaging device.

BRIEF DESCRIPTION OF THE DRAWINGS

FIG. 7 is a diagram showing a color filter employed in the first embodiment;

FIGS. 8A to 8C are timing charts of control signals supplied to a pixel transistor circuit of a pixel in an operation to take an image in the first embodiment;

FIGS. 9A to 9D are a plurality of diagrams showing a method for manufacturing the solid-state imaging device according to the first embodiment;

DETAILED DESCRIPTION OF THE PREFERRED EMBODIMENTS

Preferred embodiments of the present disclosure are explained by referring to accompanying diagrams as follows.

It is to be noted that the description of the embodiments is divided into topics arranged in the following order.
1: First Embodiment (The light absorption layer is the same layer as gates)
2: Second Embodiment (The light absorption layer is a layer different from that of gates)
3: Others
1: First Embodiment
(A) Apparatus Configuration
(A-1) Camera Principal-Element Configuration FIG. 1 is a diagram showing the configuration of a camera 40 according to a first embodiment.

Figure 1:
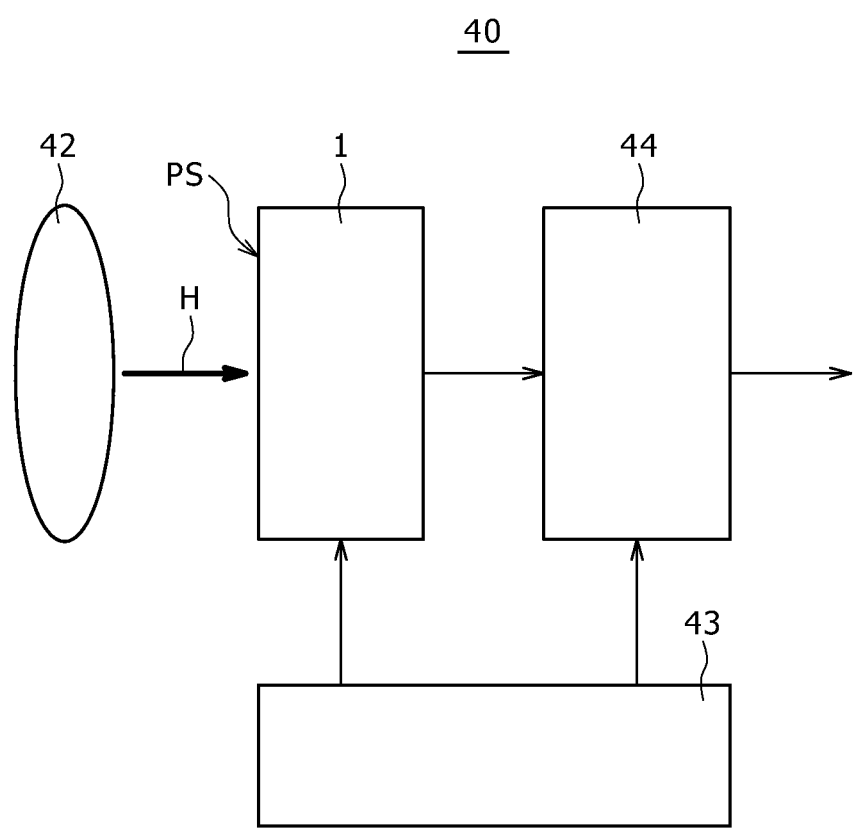
FIG. 1 is a diagram showing the configuration of a camera according to a first embodiment.

As shown in FIG. 1, the camera 40 has a solid-state imaging device 1, an optical system 42, a control section 43 and a signal processing section 44. Each of them is explained sequentially one after another as follows.

Incident light H coming from an imaging object through the optical system 42 is received by the imaging surface PS of the solid-state imaging device 1 and the solid-state imaging device 1 carries out an opto-electrical conversion process on the light H in order to generate signal electric charge. Then, the solid-state imaging device 1 reads out the signal electric charge obtained as a result of the opto-electrical conversion process and outputs the signal electric charge as an electrical signal to the signal processing section 44. The solid-state imaging device 1 carries out these operations in accordance with a control signal received from the control section 43.

The optical system 2 includes optical members such as an image creation lens and a stop. The optical system 2 converges the incident light H on the imaging surface PS of the solid-state imaging device 1.

The control section 43 outputs a variety of control signals to the solid-state imaging device 1 and the signal processing section 44 in order to control and drive the solid-state imaging device 1 and the signal processing section 44.

The signal processing section 44 processes the electrical signal received from the solid-state imaging device 1 as raw data in order to generate a digital image of the imaging object.
(A-2) Configuration of Principal Elements of the Solid-State Imaging Device The entire configuration of the solid-state imaging device 1 is explained as follows.

Figure 2:
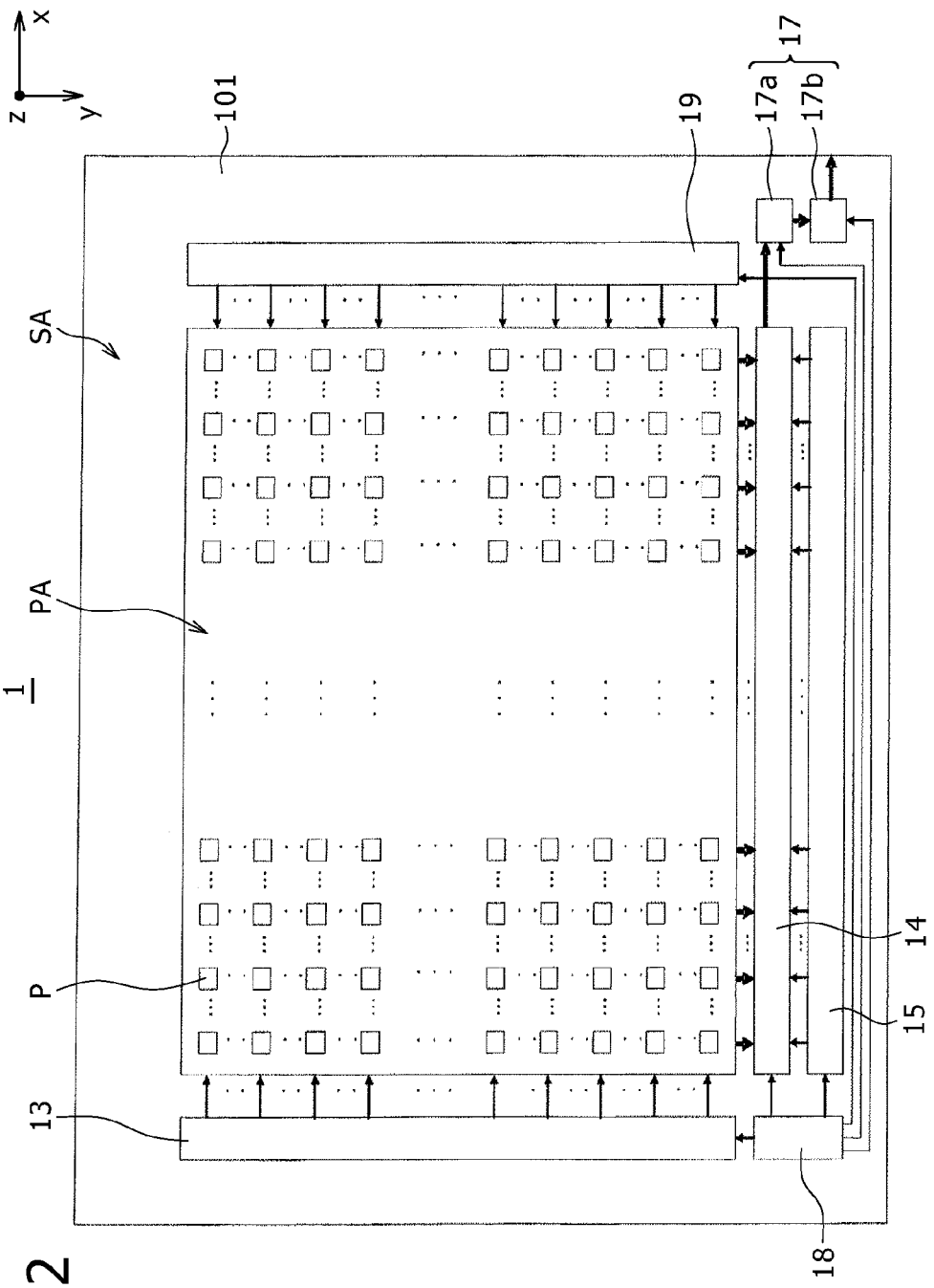
FIG. 2 is a diagram showing the entire configuration of a solid-state imaging device according to the first embodiment.

FIG. 2 is a diagram showing the entire configuration of the solid-state imaging device 1 according to the first embodiment.

As shown in FIG. 2, the solid-state imaging device 1 according to this embodiment includes a semiconductor substrate 101. The semiconductor substrate 101 is typically a single-crystal silicon substrate having a small film thickness. The surface of the semiconductor substrate 101 includes a pixel area PA and a surrounding area SA.

As shown in FIG. 2, the pixel area PA has a rectangular shape and includes a plurality of pixels P laid out in the horizontal direction x and the vertical direction y. That is to say, the pixels P are laid out to form a matrix.

Each of the pixels P in the pixel area PA is configured to receive incident light and convert the light into signal electric charge. Then, a pixel transistor circuit not shown in the figure reads out the signal electric charge and outputs the signal electric charge to the signal processing section 44 as an electrical signal. A detailed configuration of the pixel P will be described later.

As shown in FIG. 2, the surrounding area SA is placed at locations surrounding the pixel area PA. In the surrounding area SA, peripheral circuits are provided.

To put it concretely, as shown in FIG. 2, the peripheral circuits include a vertical driving circuit 13, a column circuit 14, a horizontal driving circuit 15, an external-destination output circuit 17, a TG (timing generator) 18 and a shutter driving circuit 19.

As shown in FIG. 2, in the surrounding area SA, the vertical driving circuit 13 is provided on a side of the pixel area PA. The vertical driving circuit 13 is configured to select and drive the pixels P in the pixel area PA in row units.

As shown in FIG. 2, in the surrounding area SA, the column circuit 14 is provided beneath the pixel area PA. The column circuit 14 is configured to carry out signal processing on electrical signals received from the pixels P in column units. The column circuit 14 includes a CDS (Correlated Double Sampling) circuit not shown in the figure and carries out the signal processing also in order to remove fixed-pattern noises.

As shown in FIG. 2, the horizontal driving circuit 15 is electrically connected to the column circuit 14. The horizontal driving circuit 15 typically includes a shift register and sequentially provides the external-destination output circuit 17 with signals each held in the column circuit 14 for one of the columns of the matrix of the pixels P.

As shown in FIG. 2, the external-destination output circuit 17 is also electrically connected to the column circuit 14. The external-destination output circuit 17 carries out signal processing on electrical signals received from the column circuit 14 and outputs digital signals obtained as a result of the signal processing to the signal processing section 44 external to the solid-state imaging device 1. The external-destination output circuit 17 includes an AGC (Automatic Gain Control) circuit 17a and an ADC (Analog-to-Digital Conversion) circuit 17b. In the external-destination output circuit 17, the AGC circuit 17a applies a gain to an analog electrical signal and, then, the ADC circuit 17b converts the analog electrical signal into the digital signal, outputting the digital signal to the signal processing section 44 external to the solid-state imaging device 1.

As shown in FIG. 2, the time generator 18 is electrically connected to the vertical driving circuit 13, the column circuit 14, the horizontal driving circuit 15, the external-destination output circuit 17 and the shutter driving circuit 19. The time generator 18 generates a variety of timing signals, supplying the timing signals to the vertical driving circuit 13, the column circuit 14, the horizontal driving circuit 15, the external-destination output circuit 17 and the shutter driving circuit 19 in order to drive and control each circuit.

The shutter driving circuit 19 is configured to select the pixels P in row units and adjust the exposure time for the selected pixels P.
(A-3) Detailed Configuration of the Solid-State Imaging Device A detailed configuration of the solid-state imaging device according to this embodiment is explained as follows.

FIGS. 3 to 6 are each a diagram showing principal elements employed in the solid-state imaging device 1 according to the first embodiment.

Figure 3:
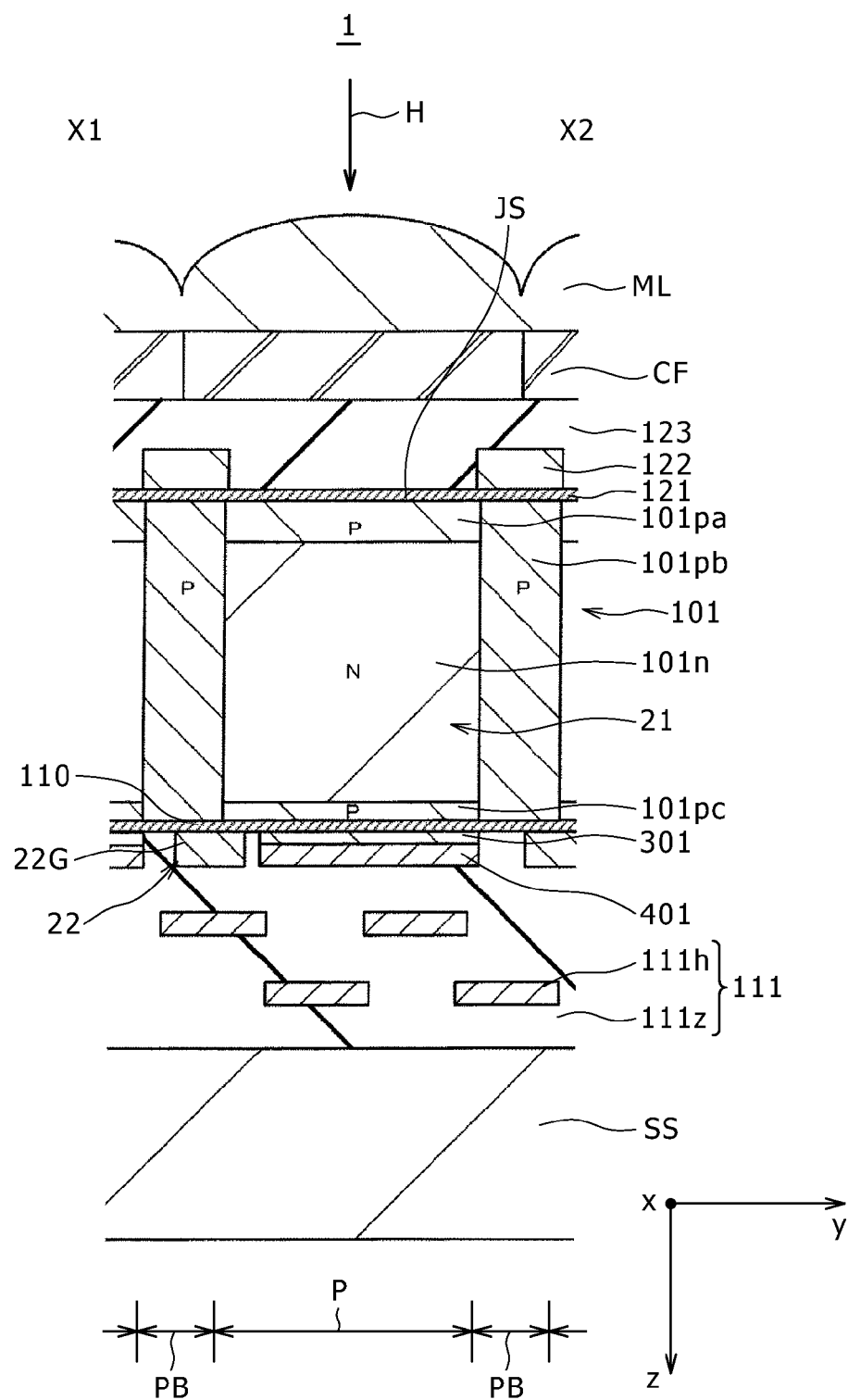
FIG. 3 is a diagram showing principal elements of the solid-state imaging device according to the first embodiment.
Figure 4:
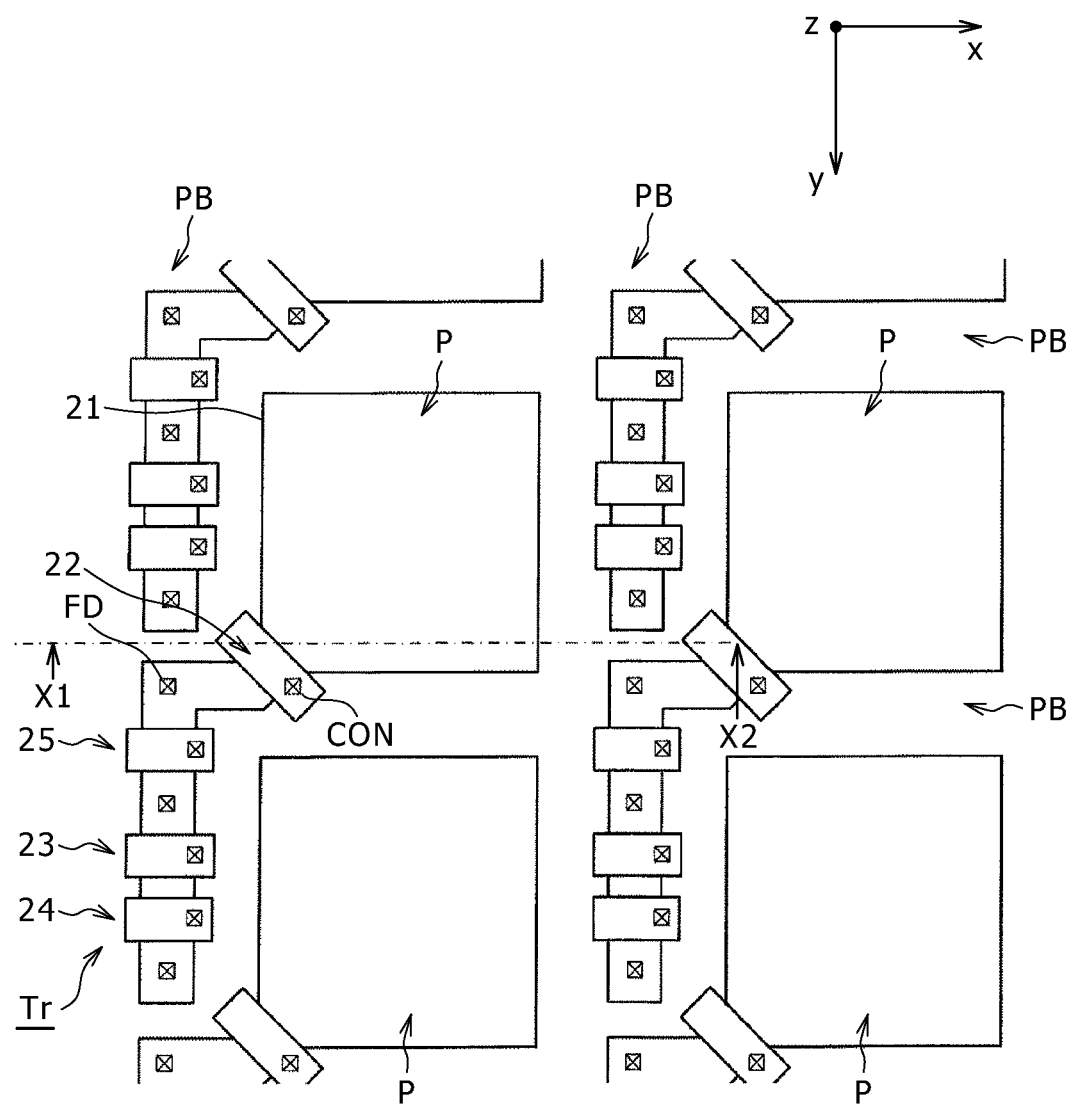
FIG. 4 is a diagram showing principal elements of the solid-state imaging device according to the first embodiment.
Figure 5:
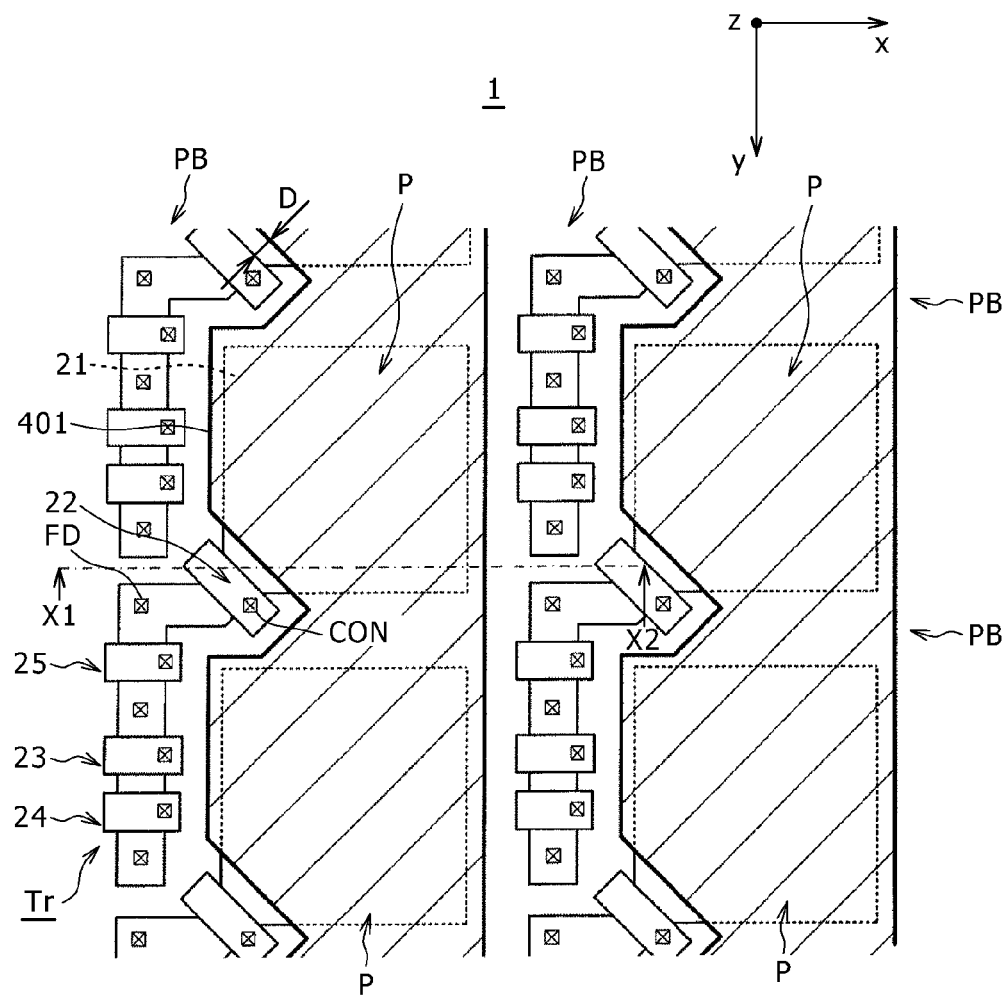
FIG. 5 is a diagram showing principal elements of the solid-state imaging device according to the first embodiment.
Figure 6:
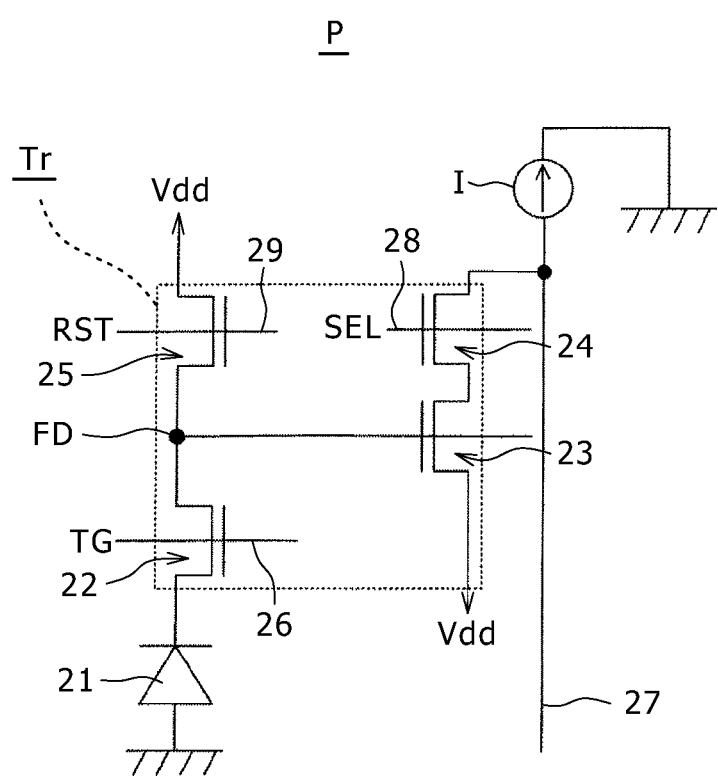
FIG. 6 is a diagram showing principal elements of the solid-state imaging device according to the first embodiment.

To be more specific, FIG. 3 is a diagram showing a cross section of the solid-state imaging device 1 including a semiconductor substrate 101. FIGS. 4 and 5 are each a diagram showing the surface of the semiconductor substrate 101 shown in FIG. 3, that is, showing a lower surface shown in FIG. 3. FIG. 6 is a diagram showing the circuit configuration of the pixel P.

To put it in detail, FIG. 3 is a diagram showing a model representing a cross section of a portion X1-X2 shown in FIGS. 4 and 5. FIG. 4 is a diagram showing the lower surface shown in FIG. 3 as the front surface of the semiconductor substrate 101 except a support substrate SS, a wiring layer 111, a light-reflection preventing film 301 and a light absorption layer 401. On the other hand, FIG. 5 is a diagram showing the lower surface shown in FIG. 3 as the front surface of the semiconductor substrate 101 with the light absorption layer 401 provided thereon as shown by a hatched portion. It is to be noted that, for the sake of drawing convenience, in the figures, the shape (including the width) of each portion may be properly changed from diagram to diagram.

As shown in FIG. 3, the solid-state imaging device 1 includes a photodiode 21 provided inside the semiconductor substrate 101. The semiconductor substrate 101 is a substrate made from a single-crystal silicon having a small film thickness.

As shown in FIG. 3, on an upper surface shown in FIG. 3 as the rear surface of the semiconductor substrate 101, there are provided a light shielding layer 122, a color filter CF and a microlens ML.

On a lower surface shown in FIG. 3 as the front surface of the semiconductor substrate 101, on the other hand, a transfer transistor 22 is provided. As shown in FIGS. 4 and 5, in addition to the transfer transistor 22, there are also provided an amplification transistor 23, a select transistor 24 and a reset transistor 25. The transfer transistor 22, the amplification transistor 23, the select transistor 24 and the reset transistor 25 compose a pixel transistor circuit Tr. However, the amplification transistor 23, the select transistor 24 and the reset transistor 25 are not shown in FIG. 3.

In addition, as shown in FIG. 3, members including the light absorption layer 401 are also provided on a lower surface shown in FIG. 3 as the front surface of the semiconductor substrate 101. Furthermore, on a lower surface shown in FIG. 3 as the front surface of the semiconductor substrate 101, the wiring layer 111 is also provided. Moreover, on a specific side of the wiring layer 111, the support substrate SS is provided. The specific side of the wiring layer 111 is a side opposite to the other side close to the semiconductor substrate 101.

That is to say, the solid-state imaging device 1 according to the embodiment is configured to work as a CMOS image sensor of the rear-surface radiation type. In the case of the rear-surface radiation type, incident light H coming from the rear surface which is an upper surface shown in FIG. 3 is received by the photodiode 21 and converted thereby into signal electric charge in an operation to take a color image.

Details of every section employed in the solid-state imaging device 1 are explained as follows.

(a) Photodiode 21

In the solid-state imaging device 1, a plurality of photodiodes 21 are laid out in the pixel area PA so that each of the photodiodes 21 is associated with one of a plurality of the pixels P shown in FIG. 2. That is to say, the photodiodes 21 are laid out on the imaging plane which is an xy plane in the horizontal direction x and the vertical direction y perpendicular to the horizontal direction x.

As described above, the photodiode 21 is configured to receive incident light H, carry out an opto-electrical conversion process to convert the incident light H into signal electric charge and then store the electric charge.

In this case, as shown in FIG. 3, the photodiode 21 receives the incident light H coming from a side close to an upper surface shown in FIG. 3 as the rear surface of the semiconductor substrate 101. As shown in FIG. 3, the color filter CF and the microlens ML are provided above the photodiode 21. Thus, the incident light H propagates to the photodiode 21 by sequentially passing through the microlens ML and the color filter CF, being received by a light receiving surface JS of the photodiode 21. Then, the photodiode 21 carries out an opto-electrical conversion process on the incident light H in order to convert the incident light H into signal electric charge as described above.

As shown in FIG. 3, the photodiode 21 is provided inside the semiconductor substrate 101.

Typically, an n-type semiconductor area 101$n$ is created as an electric-charge accumulation area used for accumulating electrons serving as electric charge. In the photodiode 21, the n-type semiconductor area 101$n$ is sandwiched by a p-type semiconductor area 101$pa$ provided on a side close to an upper surface shown in FIG. 3 as the rear surface of the n-type semiconductor area 101$n$ and a p-type semiconductor area 101$pc$ provided on a side close to a lower surface shown in FIG. 3 as the front surface of the n-type semiconductor area 101$n$. That is to say, the photodiode 21 has a HAD (Hole Accumulation Diode) structure in which the p-type semiconductor areas 101$pa$ and 101$pc$ are created in order to prevent dark currents from being generated in boundary faces on the upper-surface and lower-surface sides of the n-type semiconductor area 101$n$. The signal electric charge generated by the photodiode 21 drifts inside the n-type semiconductor area 101$n$ and is accumulated in the vicinity of the p-type semiconductor area 101$pc$ provided on a side close to a lower surface shown in FIG. 3 as the front surface of the n-type semiconductor area 101$n$.

As shown in FIGS. 3 and 4, a pixel separation section PB is provided between pixels P. The photodiode 21 is provided in an area laid out between the pixel separation sections PB as an area inside the pixel P. To put it concretely, as shown in FIG. 3, on the pixel separation section PB, a p-type semiconductor area 101$pb$ is provided, being extended through the inside of the semiconductor substrate 101 from an upper surface shown in FIG. 3 as the rear surface of the semiconductor substrate 101 to a lower surface shown in FIG. 3 as the front surface of the semiconductor substrate 101. In this way, pixels P are electrically separated from each other. As shown in FIG. 4, the pixel separation sections PB are provided to form a grid existing between pixels P. The photodiode 21 is provided in an area laid out between the pixel separation sections PB forming the grid as an area inside the pixel P.

As shown in FIG. 6, the anode of the photodiode 21 is connected to the ground. Electrons are accumulated in the photodiode 21 as signal electric charge which is read out by the pixel transistor circuit Tr. The pixel transistor circuit Tr outputs the signal electric charge to a vertical signal line 27 as an electrical signal.

(b) Light Shielding Layer 122

In the solid-state imaging device 1, as shown in FIG. 3, the light shielding layer 122 is provided on a side close to an upper surface shown in FIG. 3 as the rear surface of the semiconductor substrate 101.

In this configuration, as shown in FIG. 3, an insulation layer 121 is provided so as to cover an upper surface shown in FIG. 3 as the rear surface of the semiconductor substrate 101 whereas the light shielding layer 122 is provided on the upper surface of the insulation layer 121. On an upper surface shown in FIG. 3 as the rear surface of the semiconductor substrate 101, the light shielding layer 122 has portions corresponding to the pixel separation sections PB. However, the light shielding layer 122 does not have portions corresponding to the pixels P. That is to say, on the light receiving surface JS of the photodiode 21, an aperture exists.

It is to be noted that, though not shown in FIG. 4, the planar shape of the light shielding layer 122 is the shape of a grid similar to that formed by the pixel separation sections PB.

In this embodiment, the insulation layer 121 shown in FIG. 3 is made from typically $SiO_2$ (a silicon oxide). On the other hand, the light shielding layer 122 is made from typically a metallic material such as W (tungsten). The light shielding layer 122 can also be made properly from Al (aluminum) in place of W (tungsten).

Then, on the upper surface of the insulation layer 121, a flattening film 123 is provided so as to cover the light shielding layer 122. The flattening film 123 is made from an optically transparent material.

(c) Color Filter CF

In the solid-state imaging device 1, as shown in FIG. 3, the color filter CF is provided on the upper surface of the flattening film 123 on a side close to an upper surface shown in FIG. 3 as the rear surface of the semiconductor substrate 101.

FIG. 7 is a diagram showing a color filter CF employed in the first embodiment. To be more specific, FIG. 7 shows a top view of the color filter CF.

As shown in FIG. 7, the color filter CF includes typically a red-color filter layer CFR, a green-color filter layer CFG and a blue-color filter layer CFB. The red-color filter layer CFR, the green-color filter layer CFG and the blue-color filter layer CFB are placed at positions adjacent to each other. Each of the red-color filter layer CFR, the green-color filter layer CFG and the blue-color filter layer CFB is associated with one of the pixels P.

In this case, as shown in FIG. 7, the red-color filter layer CFR, the green-color filter layer CFG and the blue-color filter layer CFB are laid out to form typically a Bayer array. That is to say, a plurality of aforementioned green-color filter layers CFG are laid out in a diagonal direction to form a checker board design. Then, a red-color filter layer CFR and a blue-color filter layer CFB are separated away from each other in another diagonal direction to form a square block in conjunction with two green-color filter layers CFG adjacent to each other.

The red-color filter layer CFR of the color filter CF is created to have a high optical transmittance for light having a wavelength in a wavelength band of typically 625 to 740 nm for the red color. That is to say, the red-color filter layer CFR is created so as to allow the incident light H to pass through the red-color filter layer CFR and propagate to the light receiving surface JS as red-color light.

By the same token, the green-color filter layer CFG of the color filter CF is created to have a high optical transmittance for light having a wavelength in a wavelength band of typically 500 to 565 nm for the green color. Thus, the green-color filter layer CFG has a high optical transmittance for light having a wavelength shorter than the wavelength band of light passing through the red-color filter layer CFR. That is to say, the green-color filter layer CFG is created so as to allow the incident light H to pass through the green-color filter layer CFG and propagate to the light receiving surface JS as green-color light.

In the same way, the blue-color filter layer CFB of the color filter CF is created to have a high optical transmittance for light having a wavelength in a wavelength band of typically 450 to 485 nm for the blue color. Thus, the blue-color filter layer CFB has a high optical transmittance for light having a wavelength shorter than the wavelength band of light passing through the green-color filter layer CFG. That is to say, the blue-color filter layer CFB is created so as to allow the incident light H to pass through the blue-color filter layer CFB and propagate to the light receiving surface JS as blue-color light.

As described above, the red-color filter layer CFR, the green-color filter layer CFG and the blue-color filter layer CFB which compose the color filter CF have high optical transmittances for light rays of having wavelengths in wavelength bands different from each other. The red-color filter layer CFR, the green-color filter layer CFG and the blue-color filter layer CFB are each associated with one of the pixels P and laid out at positions adjacent to each other.

(d) Microlens ML

As shown in FIG. 3, in the solid-state imaging device 1, the microlens ML is provided on the upper surface of the color filter CF provided on a side close to an upper surface shown in FIG. 3 as the rear surface of the semiconductor substrate 101.

The solid-state imaging device 1 has a plurality of such microlenses ML laid out at positions each corresponding to one of the pixels P. Provided on a side close to an upper surface shown in FIG. 3 as the rear surface of the semiconductor substrate 101, the microlens ML is a convex lens having a shape protruding in the upward direction. The microlens ML is configured to converge the incident light H on the photodiode 21 of every pixel P. Typically, the microlens ML is made from transparent resin such as the styrene resin, the acryl resin or the novolac resin.

(e) Pixel Transistor Circuit Tr

In the solid-state imaging device 1, a plurality of pixel transistor circuits Tr are provided so that each of the pixel transistor circuits Tr is associated with one of the pixels P shown in FIG. 2.

As shown in FIGS. 4 to 6, the pixel transistor circuit Tr includes the transfer transistor 22, the amplification transistor 23, the select transistor 24 and the reset transistor 25. The pixel transistor circuit Tr is configured to read out signal electric charge from the photodiode 21 and output the electric charge as an electrical signal.

FIG. 3 shows the transfer transistor 22 of the pixel transistor circuit Tr. In the same way as the transfer transistor 22, however, the amplification transistor 23, the select transistor 24 and the reset transistor 25 are provided on a lower surface shown in the figure as the front surface of the semiconductor substrate 101. A gate electrode 22G of the transfer transistor 22 employed in the pixel transistor circuit Tr is created from typically silicon through typically a gate insulation film 110 which is a silicon-oxide film. By the same token, though not shown in FIG. 3, the gate electrodes of the amplification transistor 23, the select transistor 24 and the reset transistor 25 are each created from typically silicon through typically the gate insulation film 110 which is a silicon-oxide film. The transistors 22 to 25 are each an N-channel MOS transistor. In addition, on a lower surface shown in the figure as the front surface of the semiconductor substrate 101, the transistors 22 to 25 are covered by the wiring layer 111.

As shown in FIGS. 4 and 5, in the pixel transistor circuit Tr, the transfer transistor 22 is provided at a location close to the photodiode 21. In this configuration, as shown in FIG. 6, the transfer transistor 22 is provided at a location between the photodiode 21 and a floating diffusion FD so that the transfer transistor 22 is capable of transferring signal electric charge from the photodiode 21 to the floating diffusion FD. To put it concretely, the gate electrode of the transfer transistor 22 is electrically connected to a transfer line 26. On the basis of a transfer signal TG supplied from the transfer line 26 to the gate electrode of the transfer transistor 22, the transfer transistor 22 transfers signal electric charge accumulated in the photodiode 21 to the floating diffusion FD.

As shown in FIGS. 4 and 5, the amplification transistor 23 employed in the pixel transistor circuit Tr is provided at a location sandwiched between the select transistor 24 and the reset transistor 25 in the pixel separation section PB. As shown in FIG. 6, the amplification transistor 23 is configured to amplify an input electrical signal appearing at the floating diffusion FD and output the amplified signal. The input electrical signal is a voltage obtained as a result of a conversion process carried out on the signal electric charge in order to convert the electrical charge into the voltage. To put it concretely, the gate electrode of the amplification transistor 23 is electrically connected to the floating diffusion FD. In addition, the drain electrode of the amplification transistor 23 is electrically connected to a power-supply supply line Vdd whereas the source electrode of the amplification transistor 23 is electrically connected to the select transistor 24. When the select transistor 24 is selected and put in a turned-on state by a select signal SEL supplied to the gate electrode of the select transistor 24, a constant-current source I supplies a constant current to the amplification transistor 23 through the select transistor 24 so that the amplification transistor 23 operates as a source follower. Thus, by supplying the select signal SEL to the gate electrode of the select transistor 24, the amplification transistor 23 amplifies the electrical signal which is a voltage obtained as a result of a conversion process carried out in the floating diffusion FD on the signal electric charge in order to convert the electrical charge into the voltage.

As shown in FIGS. 4 and 5, the select transistor 24 employed in the pixel transistor circuit Tr is provided to line up with the amplification transistor 23 and the reset transistor 25 in a pixel separation section PB. In this configuration, with the select transistor 24 selected by the select signal SEL, as shown in FIG. 6, the select transistor 24 passes on the electrical signal, which is output by the amplification transistor 23, to the vertical signal line 27. To put it concretely, the gate electrode of the select transistor 24 is electrically connected to an address line 28 conveying the select signal SEL. When the select signal SEL is supplied to the gate electrode of the select transistor 24, the select transistor 24 is put in a turned-on state, passing on the electrical signal, which is output by the amplification transistor 23 as a result of amplification, to the vertical signal line 27.

As shown in FIGS. 4 and 5, the reset transistor 25 employed in the pixel transistor circuit Tr is provided to line up with the amplification transistor 23 and the select transistor 24 in a pixel separation section PB. As shown in FIG. 6, the reset transistor 25 is configured to reset an electric potential appearing on the gate electrode of the amplification transistor 23. To put it concretely, the gate electrode of the reset transistor 25 is electrically connected to a reset line 29 conveying a reset signal RST. In addition, the drain electrode of the reset transistor 25 is electrically connected to the power-supply supply line Vdd whereas the source electrode of the reset transistor 25 is electrically connected to the floating diffusion FD. On the basis of the reset signal RST supplied from the reset line 29 to the reset transistor 25, the reset transistor 25 resets the electric potential appearing on the floating diffusion FD electrically connected to the gate electrode of the amplification transistor 23 to the voltage of a power supply.

FIGS. 8A to 8C are timing charts of control signals supplied to the pixel transistor circuit Tr of a pixel P in an operation to take an image in the first embodiment.

To be more specific, FIG. 8A shows the timing chart of the select signal SEL supplied to the gate electrode of the select transistor 24 whereas FIG. 8B shows the timing chart of the reset signal RST supplied to the gate electrode of the reset transistor 25. On the other hand, FIG. 8C shows the timing chart of the transfer signal TG supplied to the gate electrode of the transfer transistor 22 (refer to FIG. 6).

As shown in FIGS. 8A to 8C, when an operation to take an image is carried out, at a first time point t1, the select signal SEL is raised to a high level in order to put the select transistor 24 in a turned-on state. Then, at a second time point t2, the reset signal RST is raised to a high level in order to put the reset transistor 25 in a turned-on state. Thus, the electric potential appearing on the gate electrode of the amplification transistor 23 is reset (refer to FIG. 6).

Subsequently, as shown in FIGS. 8A to 8C, at a third time point t3, the reset signal RST is pulled down to a low level in order to put the reset transistor 25 in a turned-off state. Then, later on, a voltage representing a reset level is read out and supplied to the column circuit 14 as an output signal (refer to FIGS. 2 and 6).

Subsequently, as shown in FIGS. 8A to 8C, at a fourth time point t4, the transfer signal TG is raised to a high level in order to put the transfer transistor 22 in a turned-on state. For example, a negative voltage has been applied to the gate electrode of the transfer transistor 22 in order to put the transfer transistor 22 in a turned-off state during an electric-charge accumulation period. With the transfer transistor 22 put in a turned-off state, the transfer signal TG raised to a high level to become a positive voltage is applied to the gate electrode of the transfer transistor 22 in order to put the transfer transistor 22 in a turned-on state. Thus, signal electric charge accumulated in the photodiode 21 during the electric-charge accumulation period is transferred to the floating diffusion FD (refer to FIG. 6).

Then, as shown in FIGS. 8A to 8C, at a fifth time point t5, the transfer signal TG is pulled down to a low level in order to put the transfer transistor 22 in a turned-off state. Thereafter, the voltage representing a signal level according to the signal electric charge accumulated in the photodiode 21 is supplied to the column circuit 14 as an output signal (refer to FIGS. 2 and 6). Subsequently, the select signal SEL is pulled down to a low level in order to put the select transistor 24 in a turned-off state.

The column circuit 14 carries out differential processing on the signal supplied thereto earlier to represent the reset level and the signal supplied thereto later to represent the signal level according to the signal electric charge accumulated in the photodiode 21. Then, the column circuit 14 stores a signal obtained as a result of the differential processing (refer to FIG. 2). It is thus possible to cancel fixed-pattern noises generated by, among others, variations of the threshold voltages with of the transistors provided in every pixel P from pixel P to pixel P.

As described above, operations to drive the pixels P are carried out in row units each including a plurality of pixels P laid out in the horizontal direction x. The gate electrodes of the transfer transistors 22 each employed in one of the pixels P provided on a row are connected to each other by a transfer line 26 provided for the row. By the same tokens, the gate electrodes of the select transistors 24 each employed in one of the pixels P provided on a row are connected to each other by an address line 28 provided for the row. In the same way, the gate electrodes of the reset transistors 25 each employed in one of the pixels P provided on a row are connected to each other by a reset line 29 provided for the row. Thus, an operation to drive the pixels P provided on a row can be carried out at the same time for the pixels P on the row.

To put it concretely, the select signal SEL supplied by the vertical driving circuit 13 described earlier selects a horizontal line referred to as a pixel row from pixel rows in the matrix sequentially one row after another in the vertical direction y. Then, a variety of timing signals generated by the time generator 18 control the transistors employed in each of the pixels P. Thus, for every column of the pixels P, an electrical signal generated in each of the pixels P is supplied to the column circuit 14 to be stored therein through a vertical signal line 27 provided for the column. Subsequently, the horizontal driving circuit 15 selects a signal stored in the column circuit 14 and outputs the selected signals sequentially to the external-destination output circuit 17 (refer to FIGS. 2 and 6).

Then, the signal processing section 44 carries out signal processing on signals obtained from the operation to take an image by handling the signals as raw data in order to generate a digital image (refer to FIG. 1).

(f) Light-Reflection Preventing Film 301 And Light Absorption Layer 401

As shown in FIG. 3, in the solid-state imaging device 1, each of the light-reflection preventing film 301 and the light absorption layer 401 is provided on a lower surface shown in the figure as the front surface of the semiconductor substrate 101.

In this configuration, as shown in FIG. 3, the gate insulation film 110 is provided so as to cover the entire lower surface shown in the figure as the front surface of the semiconductor substrate 101. Then, the light-reflection preventing film 301 is provided on the gate insulation film 110 to form a stack in conjunction with the gate insulation film 110. The light-reflection preventing film 301 is provided on the same layer as the gate electrode 22G without covering the gate electrode 22G.

The incident light H coming from an imaging object includes light capable of passing through the photodiode 21. The light-reflection preventing film 301 is configured to prevent the light passing through the photodiode 21 from being reflected on the boundary face between the gate insulation film 110 and the light absorption layer 401.

To put it concretely, the light-reflection preventing film 301 is created by setting the film thickness thereof at a proper value from a properly selected material so as to allow a light-reflection preventing function to be implemented on the basis of an optical interference effect. The properly selected material used for making the light-reflection preventing film 301 is an insulation material having a refraction index between the refraction index of a material used for making the gate insulation film 110 and the refraction index of a material used for making the light absorption layer 401.

As shown in FIG. 3, the light absorption layer 401 is provided on the light-reflection preventing film 301 created on the gate insulation film 110 provided on a lower surface shown in the figure as the front surface of the semiconductor substrate 101. The light absorption layer 401 is provided on the same layer as the gate electrode 22G of the transfer transistor 22 without covering the gate electrode 22G.

As shown in FIG. 5, the light absorption layer 401 is created below a lower surface shown in the FIG. 3 as the front surface of the semiconductor substrate 101 so as to cover a portion at which the photodiode 21 is provided. However, the light absorption layer 401 provided below a lower surface shown in the FIG. 3 as the front surface of the semiconductor substrate 101 does not cover a portion at which the pixel transistor circuit Tr including the transfer transistor 22 is provided. The light absorption layer 401 is provided as a single junction between pixels P lined up in the vertical direction y.

In addition, as shown in FIG. 5, the light absorption layer 401 is created so that the width D of a gap between the light absorption layer 401 and the gate electrodes of the transistors 22 to 25 which are provided on the same layer is equal to or greater than 0.1 μm. It is thus possible to prevent a bad electrical effect from being generated in the gap between the light absorption layer 401 and the gate electrodes of the transistors 22 to 25. These gate electrodes include the gate electrode 22G shown in FIG. 3 as the gate electrode of the transfer transistor 22.

As described above, the incident light H coming from an imaging object includes light capable of passing through the photodiode 21. The light absorption layer 401 is configured to absorb the light capable of passing through the photodiode 21. To put it in detail, the incident light H coming from a side close to a upper surface shown in the FIG. 3 as the rear surface of the semiconductor substrate 101 includes light capable of passing through the photodiode 21 as light other than light absorbed by the photodiode 21. The light absorption layer 401 is configured to absorb the light capable of passing through the photodiode 21 in order to block this light before this light attains the wiring layer 111.

To put it concretely, the light absorption layer 401 is created by making use of a material having a light absorption coefficient greater than the single-crystal silicon serving as a material used for making the semiconductor substrate 101. For example, the light absorption layer 401 is created by making use of the amorphous silicon. Even though FIG. 5 does not show the light-reflection preventing film 301, the light-reflection preventing film 301 has the same planar shape as the light absorption layer 401.

(g) Wiring Layer 111

In the solid-state imaging device 1, as shown in FIG. 3, the wiring layer 111 is provided on a lower surface shown in the figure as the front surface of the semiconductor substrate 101.

As shown in FIG. 3, the wiring layer 111 includes wires 111h and an insulation layer 111z which is an inter-layer insulation film. The wiring layer 111 is the so-called multilayer wiring layer which is a stack constructed by alternately creating the inter-layer insulation film serving as the insulation layer 111z and the wires 111h a plurality of times. Typically, the wires 111h are created from a metallic material such as the aluminum. On the other hand, the insulation layer 111z is typically created from an insulation material such as a silicon oxide.

In the wiring layer 111, the wires 111h are created between aforementioned insulation layers 111z to electrically connect elements to each other. In the wiring layer 111, each wiring is electrically connected the pixel transistor circuit Tr, for example. The wires 111h electrically connect the transfer transistor 22, the amplification transistor 23, the select transistor 24 and the reset transistor 25 to each other through contacts CON. That is to say, the wiring layer 111 is constructed as a stack by alternately creating the insulation layer 111z and the wires 111h a plurality of times so that the wires 111h function as a variety of wires such as the transfer line 26, the vertical signal line 27, the address line 28 and the reset line 29 which are shown in FIG. 6.

In addition, the wires 111h are created so that the width of the gap between the wires 111h and the light absorption layer 401 is equal to or greater than 0.1 μm. It is thus possible to prevent a bad electrical effect from being generated in the gap between the light absorption layer 401 and the wires 111h.

Then, on a surface on a specific side of the wiring layer 111, a support substrate SS is provided. This specific side is opposite to a side on which the semiconductor substrate 101 is provided. The support substrate SS is made from a silicon semiconductor and has a typical thickness of several hundreds of μm.

(B) Manufacturing Method

Next, principal elements of a method for manufacturing the solid-state imaging device 1 are explained as follows.

FIGS. 9A to 9D are a plurality of diagrams showing the method for manufacturing the solid-state imaging device 1 according to the first embodiment.

Each of FIGS. 9A to 9D is a cross-sectional diagram like FIG. 3.

FIGS. 9A to 9D are referred to in description of processes (a) to (d) carried out to manufacture the solid-state imaging device 1 shown in diagrams such as FIG. 3 as a device according to the embodiment.

Processes shown in FIGS. 9A to 9D are explained sequentially in detail as follows.

(a) Creation of Elements Including the Photodiode 21 (FIG. 9A)

First of all, members including the photodiode 21 are created as shown in FIG. 9A.

In this process, from an upper surface shown in FIG. 9A as the front surface of the semiconductor substrate 101 made from a single-crystal silicon semiconductor, ions each serving as an impurity are injected in order to create members including the photodiode 21. To put it concretely, the p-type semiconductor areas 101pa, 101pb and 101pc as well as the n-type semiconductor area 101n are created in the semiconductor substrate 101.

(b) Creation of Elements Including the Transfer Transistor 22 (FIG. 9B)

Then, members including the transfer transistor 22 are created as shown in FIG. 9B.

In this process, typically, thermal oxidation method is adopted in order to create a silicon-oxide film on an entire upper surface shown in FIG. 9B as the front surface of the semiconductor substrate 101 so as to provide the gate insulation film 110.

Then, the gate electrode 22G is created on an upper surface shown in FIG. 9B as the front surface of the gate insulation film 110. In the process of creating the gate electrode 22G, a film is formed from a conductive material typically under conditions described below in order to provide a conductive layer not shown in the figure. Subsequently, a pattern creation work is carried out on the conductive layer not shown in the figure in order to form the gate electrode 22G.

Conditions
  Material: Polysilicon
  Thickness: 100 to 300 nm
  Film creation method: CVD method The gate electrodes of the transistors 23 to 25 which are other than the transfer transistor 22 are also created in the same way as the gate electrode 22G of the transfer transistor 22. Then, the source and drain electrodes of the transistors 22 to 25 are created. In this way, the pixel transistor circuit Tr is created on an upper surface shown in FIGS. 9A to 9D as the front surface of the semiconductor substrate 101.

Figure 9C:
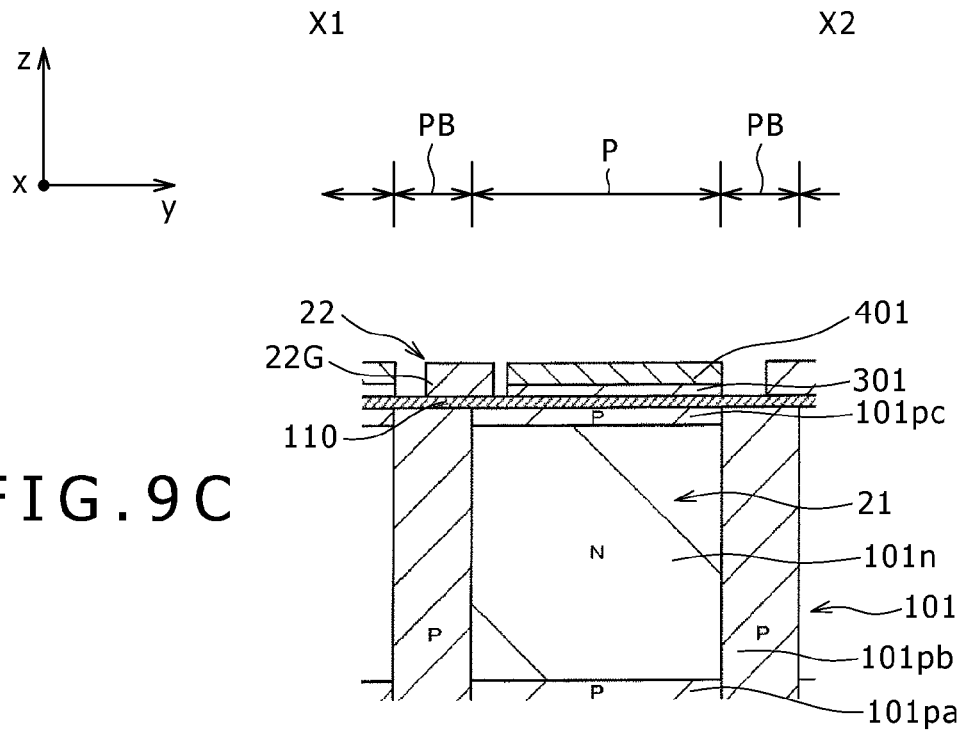

(c) Creation of the Light-Reflection Preventing Film 301 and the Light Absorption Film 401 (FIG. 9C)

Next, the light-reflection preventing film 301 and the light absorption layer 401 are created as shown in FIG. 9C.

In this process, the light-reflection preventing film 301 is created on an upper surface shown in FIG. 9C as the front surface of the gate insulation film 110. Then, the light absorption layer 401 is created on an upper surface shown in FIG. 9C as the front surface of the light-reflection preventing film 301.

The light-reflection preventing film 301 is created by setting the film thickness thereof at a proper value from a properly selected material so as to allow a light-reflection preventing function to be implemented on the basis of an optical interference effect. The properly selected material used for making the light-reflection preventing film 301 is an insulation material having a refraction index between the refraction index of a material used for making the gate insulation film 110 and the refraction index of a material used for making the light absorption layer 401.

For example, it is preferable to create the light-reflection preventing film 301 from a material with its refraction index n0 satisfying an equation described below. Thus, since incident light having a wavelength λ can be cancelled by interferences, the light-reflection preventing function can be well implemented. In the following equation, notation n1 denotes the refraction index of the light absorption layer 401 positioned above the light-reflection preventing film 301 whereas notation n2 denotes the refraction index of the silicon semiconductor substrate 101 (Si) positioned below the light-reflection preventing film 301. The refraction index n2 of the silicon semiconductor substrate 101 is 4.2 (that is, n2=4.2).

$$(n2-n0)^2/(n2+n0)^2=(n0-n1)^2/(n0+n1)^2$$

That is to say, let the light absorption layer 401 be made from a-Si and let the refraction index n1 of the light absorption layer 401 have a value in a range of 1.4 to 3.5 (that is, 1.4≤n1≤3.5). In other words, let the refraction index n1 of the light absorption layer 401 have a typical value of 3.0. In addition, let the gate insulation film 110 be made from a silicon oxide and the refraction index n2 of the gate insulation film 110 have a value of 1.4 (that is, n2=1.4). In this case, the light-reflection preventing film 301 is created from a material with its refraction index n0 of about 2.0.

In addition, if the light-reflection preventing film 301 is made from a material having a refraction index n0, it is preferable to create the light-reflection preventing film 301 with its thickness d satisfying the following equation:

$$d=\lambda/(2 \times n0) \times (m+1/2) \text{ where } m=0, 1, 2 \text{ and}$$

so on.

That is to say, let the refraction index n1 of a material used for making the light absorption layer 401 have a value of 2.0. In this case, in order to prevent light having a typical wavelength λ of 800 nm from being reflected for example, from the above equation, the light-reflection preventing film 301 is so created that the thickness d of the light-reflection preventing film 301 is equal to 100 nm (for m=0). As an alternative, the light-reflection preventing film 301 is so created that the thickness d of the light-reflection preventing film 301 is equal to 300 nm (for m=1) or 500 nm (for m=2).

Then, after a film creation process for the light absorption layer 401 is carried out under typical conditions described below, a pattern creation work is performed in order to create the light absorption layer 401.

Conditions
  Material: Amorphous silicon
  Thickness: 50 to 1,000 nm
  Film creation method: CVD method (d) Creation of the Wiring Layer 111 (FIG. 9D)

Figure 9D:
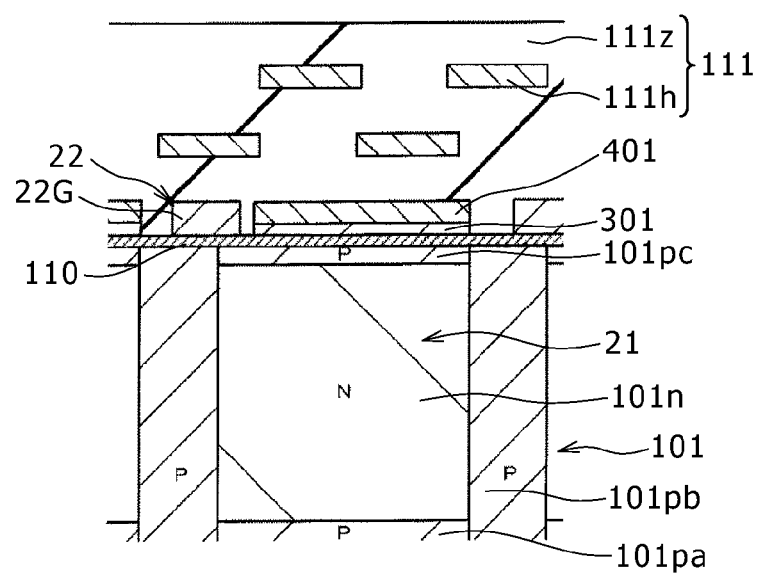

Then, the wiring layer 111 is created as shown in FIG. 9D.

In this process, the wiring layer 111 is created so as to cover an upper surface shown in FIG. 9D as the front surface of the semiconductor substrate 101 in which members including the light absorption layer 401 have been provided.

(e) Creation of Other Members

Then, on a lower surface shown in FIG. 3 but on an upper surface shown in FIG. 9D as the front surface of the wiring layer 111, the support substrate SS is properly pasted as shown in FIG. 3. Subsequently, a film thinning process is carried out on the semiconductor substrate 101. For example, a CMP (Chemical Mechanical Polishing) process is carried out on the rear surface of the semiconductor substrate 101 in order to decrease the thickness of the semiconductor substrate 101, for example, from 2.0 µm to 1.0 µm. In FIG. 3, the rear surface of the semiconductor substrate 101 is an upper surface.

It is to be noted that members such as the photodiode 21 and the pixel transistor circuit Tr are created also on a semiconductor layer of an SOI (Silicon on Insulator) substrate shown in none of the figures and, in the same say as what has been described above, a film thinning process may be carried out after the wiring layer 111 and the support substrate SS have been provided.

Then, as shown in FIG. 3, the light shielding layer 122, the color filter CF and the microlens ML are created.

By sequentially carrying out the above processes as explained so far, a CMOS image sensor of the rear-surface radiation type is completed. It is to be noted that the execution order of the process of creating the pixel transistor circuit Tr including the transfer transistor 22 and the processes of creating the light-reflection preventing film 301 as well as the light absorption layer 401 can be reversed.

(C) Conclusions

As described above, in this embodiment, the photodiode 21 for receiving incident light H and generating signal electric charge from the incident light H is provided in the semiconductor substrate 101. The incident light H includes light in the visible-light domain. The photodiode 21 is configured to receive the light in the visible-light domain and generate the signal electric charge from the light. In addition, the pixel transistor circuit Tr is provided on a side close to a lower surface shown in FIG. 3 as the front surface of the semiconductor substrate 101. The lower surface shown in FIG. 3 as the front surface of the semiconductor substrate 101 is a surface on a side opposite to an upper surface shown in FIG. 3 as the rear surface of the semiconductor substrate 101. The upper surface shown in FIG. 3 as the rear surface of the semiconductor substrate 101 is a surface at which the incident light H arrives. The pixel transistor circuit Tr is configured to output the signal electric charge, which has been generated by the photodiode 21, as an electrical signal. Then, as shown in FIG. 3, the wiring layer 111 including the wires 111h connected to the pixel transistor circuit Tr is provided so as to cover the pixel transistor circuit Tr on the side close to the front surface of the semiconductor substrate 101.

In the solid-state imaging device 1 having the rear-surface radiation type, the incident light H coming from a light source provided above the solid-state imaging device 1 may pass through the semiconductor substrate 101 in some cases. Then, the incident light H passing through the semiconductor substrate 101 may be reflected by the wires 111h of the wiring layer 111 and may arrive again at the photodiode 21 of the semiconductor substrate 101 in some cases. Since the light arriving again at the photodiode 21 may cause the photodiode 21 to generate signal electric charge in some cases, a signal representing the signal electric charge may contain noises so that the quality of the taken image may deteriorate in some cases.

In the case of this embodiment, however, as shown in FIG. 3, on a side close to a lower surface shown in the figure as the front surface of the semiconductor substrate 101, the light absorption layer 401 is provided. In this configuration shown in FIG. 3, the light absorption layer 401 is provided between the wiring layer 111 and a portion included in a lower surface shown in the figure as the front surface of the semiconductor substrate 101 as a portion at which the photodiode 21 is created so that light passing through the semiconductor substrate 101 as part of the incident light H is absorbed by the light absorption layer 401.

In the case of this embodiment, the light absorption layer 401 is made from the amorphous silicon. The amorphous silicon has a light absorption coefficient greater than that of the single-crystal silicon, from which the semiconductor substrate 101 is made, by at least one digit.

To put it concretely, the following description compares the light absorption coefficient of the amorphous silicon with that of the single-crystal silicon. In addition, the following description also compares the fundamental absorption edge of the amorphous silicon with that of the single-crystal silicon.

The light absorption coefficients of the amorphous silicon are given as follows:

200 $cm^{-1}$ for an incident-light wavelength $\lambda$ of 800 nm
8,000 $cm^{-1}$ for an incident-light wavelength $\lambda$ of 650 nm
60,000 $cm^{-1}$ for an incident-light wavelength $\lambda$ of 540 nm The light absorption coefficients of the single-crystal silicon are given as follows:

1,300 $cm^{-1}$ for an incident-light wavelength $\lambda$ of 800 nm
4,500 $cm^{-1}$ for an incident-light wavelength $\lambda$ of 650 nm
10,000 $cm^{-1}$ for an incident-light wavelength $\lambda$ of 540 nm The fundamental absorption edge of the amorphous silicon:

690 nm (a band gap of 1.8 eV)

The fundamental absorption edge of the single-crystal silicon:

1,100 nm (a band gap of 1.12 eV)

Thus, for a film thickness of 600 nm for example, the quantity of the reflection of red-color light from the wiring layer 111 to the light receiving section is reduced to a fraction equal to or smaller than 1/10 in comparison with a configuration having no light absorption layer 401.

The light absorption layer 401 is created so as to absorb more light in the visible-light domain than the semiconductor substrate 101. Thus, the light absorption layer 401 absorbs light propagating to the wiring layer 111 through the semiconductor substrate 101 before the light arrives at the wiring layer 111.

Accordingly, since the embodiment is capable of preventing light from being reflected by the wires 111h included in the wiring layer 111, the quality of the taken image can be improved.

In addition, the embodiment also includes the light-reflection preventing film 301 provided between a lower surface shown in FIG. 3 as the front surface of the semiconductor substrate 101 and the light absorption layer 401. Thus, the embodiment is capable of preventing the incident light H passing through the semiconductor substrate 101 from being reflected by the boundary face between a lower surface shown in FIG. 3 as the front surface of the semiconductor substrate 101 and the light absorption layer 401. As a result, since the light absorption layer 401 is capable of absorbing light with a high degree of efficiency, the quality of the taken image can be further improved.

(D) Modified Versions
(D-1) First Modified Version

In the case of the first embodiment described above, the light absorption layer 401 is made from undoped amorphous silicon. However, materials used for making the light absorption layer 401 are by no means limited to the undoped amorphous silicon. That is to say, the light absorption layer 401 can also be made from a material other than the undoped amorphous silicon.

In the case of pure amorphous silicon, the band gap has a value approximately in a range of 1.4 eV to 1.8 eV. For a band gap of 1.8 eV, the fundamental absorption edge has a value of about 690 nm. Thus, if the light absorption layer 401 is made from amorphous silicon, light having a large wavelength is not absorbed that much. A typical example of the light having a large wavelength is light in the infrared domain. In addition, the single-crystal silicon absorbs incident light with a small wavelength to a small depth from a surface hit by the light. However, the single-crystal silicon absorbs incident light with a large wavelength deeply from a surface hit by the light. Thus, light having a large wavelength propagates to the wiring layer 111 after passing through the semiconductor substrate 101 made from the single-crystal silicon. The light is then reflected by the wires 111h of the wiring layer 111 so that the quality of the taken image deteriorates.

However, the light absorption layer 401 is made from the amorphous silicon doped with typically Ge or the like in order to make it possible to set the band gap at a value close to a value of 1.1 eV which is the band gap of the single-crystal silicon and to set the fundamental absorption edge at a value corresponding to a larger wavelength.

In this case, it is preferable to create the light absorption layer 401 under typical conditions described below.
Ge Used as a Dopant The concentration of Ge in the amorphous silicon is in a typical range of 10 to 30 at. %

In this case, the value of the fundamental absorption edge is 890 nm for a band gap of 1.4 eV whereas the value of the light absorption coefficient is 10,000 $cm^{-1}$ for a wave length of 800 nm or 60,000 $cm^{-1}$ for a wave length of 650 nm.

In addition, even if the light absorption layer 401 is made from microcrystal silicon, like what is described above, it is possible to set the fundamental absorption edge at a value corresponding to a larger wavelength.

In this case, it is preferable to create the light absorption layer 401 under typical conditions described below.
Light Absorption Layer 401 Made from Small-Crystal Silicon The crystal particle radius: 4 to 100 nm
Thickness: 50 to 1,000 nm
Light absorption coefficient of microcrystal silicon:
1,300 $cm^{-1}$ for an incident-light wavelength λ of 800 nm
6,000 $cm^{-1}$ for an incident-light wavelength λ of 650 nm
20,000 $cm^{-1}$ for an incident-light wavelength λ of 540 nm
Fundamental absorption edge of microcrystal silicon: 1,100 nm (a band gap of 1.12 eV)

Thus, this modified version is capable of further improving the quality of the taken image. It is to be noted that, since materials cited in the description of this modified version can be manufactured with ease by making use of semiconductor-device manufacturing facilities, effects of the use of the materials on the capital investment and the manufacturing cost are small.
(D-2) Second Modified Version FIG. 10 is a diagram showing principal elements of a solid-state imaging device according to a second modified version of the first embodiment.

Figure 10:
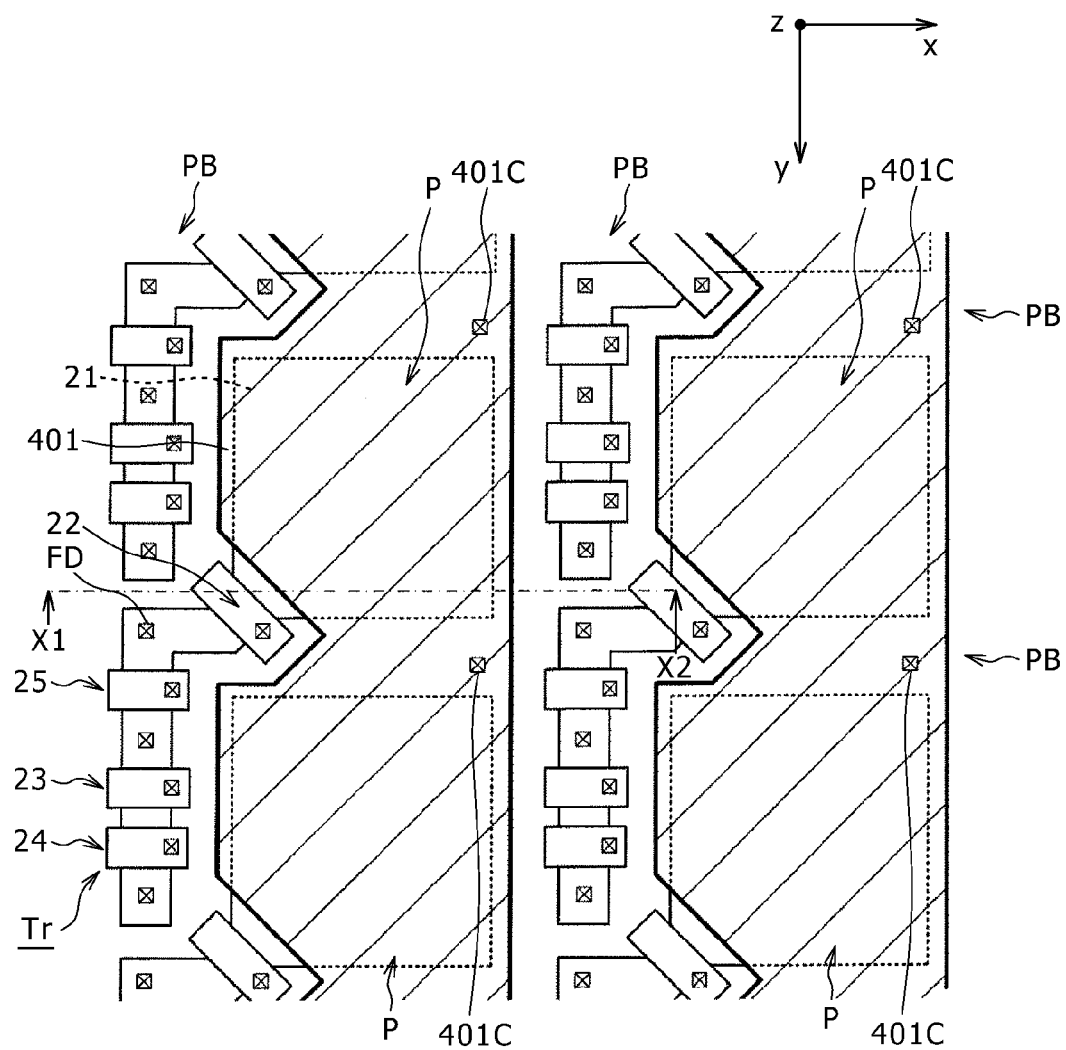
FIG. 10 is a diagram showing principal elements of a solid-state imaging device according to a modified version of the first embodiment.

In the same way as FIG. 5, FIG. 10 is a diagram showing principal elements included in the solid-state imaging device as elements on a side close to a lower surface shown in FIG. 3 as the front surface of the semiconductor substrate 101.

As shown in FIG. 10, a contact 401C can be provided on the light absorption layer 401. That is to say, it is possible to provide a configuration in which the light absorption layer 401 and the wires 111h included in the wiring layer 111 as shown in FIG. 3 are electrically connected to each other through the contact 401C.

In the case of such a configuration, it is preferable to create the light absorption layer 401 from typically microcrystal silicon doped with B so as to make the light absorption layer 401 conductive.

Then, a voltage is applied to the light absorption layer 401 through the wires 111h connected to the light absorption layer 401 so as to prevent a dark current from being generated on a lower surface shown in FIG. 3 as the front surface of the semiconductor substrate 101.

In the case of this modified version, a typical negative voltage in a range of −2.7 to −1.0 V is applied to the light absorption layer 401. To put it in detail, the negative voltage is applied to the light absorption layer 401 throughout an entire time period shown in FIGS. 8A to 8C as a time period between the times t1 and t5. During this time period, all operations are carried out sequentially. The operations include a signal electric-charge accumulation period, a signal electric-charge read period and a reset period. Thus, holes are accumulated in the vicinity of a lower surface shown in FIG. 3 as the front surface of the semiconductor substrate 101. As a result, it is possible to prevent a dark current from being generated due to a dangling bond effect on a boundary face on a lower surface shown in FIG. 3 as the front surface of the semiconductor substrate 101.

It is to be noted that, during the signal electric-charge read operation carried out in a time period between the times t4 and t5 shown in FIGS. 8A to 8C, a positive voltage may be applied to the light absorption layer 401 temporarily. In this case, the positive voltage applied to the light absorption layer 401 is lower than a positive voltage applied to the gate electrode 22G of the transfer transistor 22 during the electric-charge read period. For example, the positive voltage applied to the gate electrode 22G of the transfer transistor 22 is +3.3 V or +2.7 V whereas the positive voltage applied to the light absorption layer 401 is 1.0 V. Thus, the light absorption layer 401 causes the accumulated signal electric charge to make a movement of approaching a lower surface shown in FIG. 3 as the front surface of the semiconductor substrate 101. As a result, the signal electric-charge read operation to read out signal electric charge can be carried out effectively (for example, refer to Japanese Patent Laid-Open No. 2007-258684).

Accordingly, this modified version is capable of further improving the quality of the taken image.
2: Second Embodiment
(A) Device Configuration FIGS. 11 and 12 are each a diagram showing principal elements of a solid-state imaging device according to a second embodiment.

Figure 11:
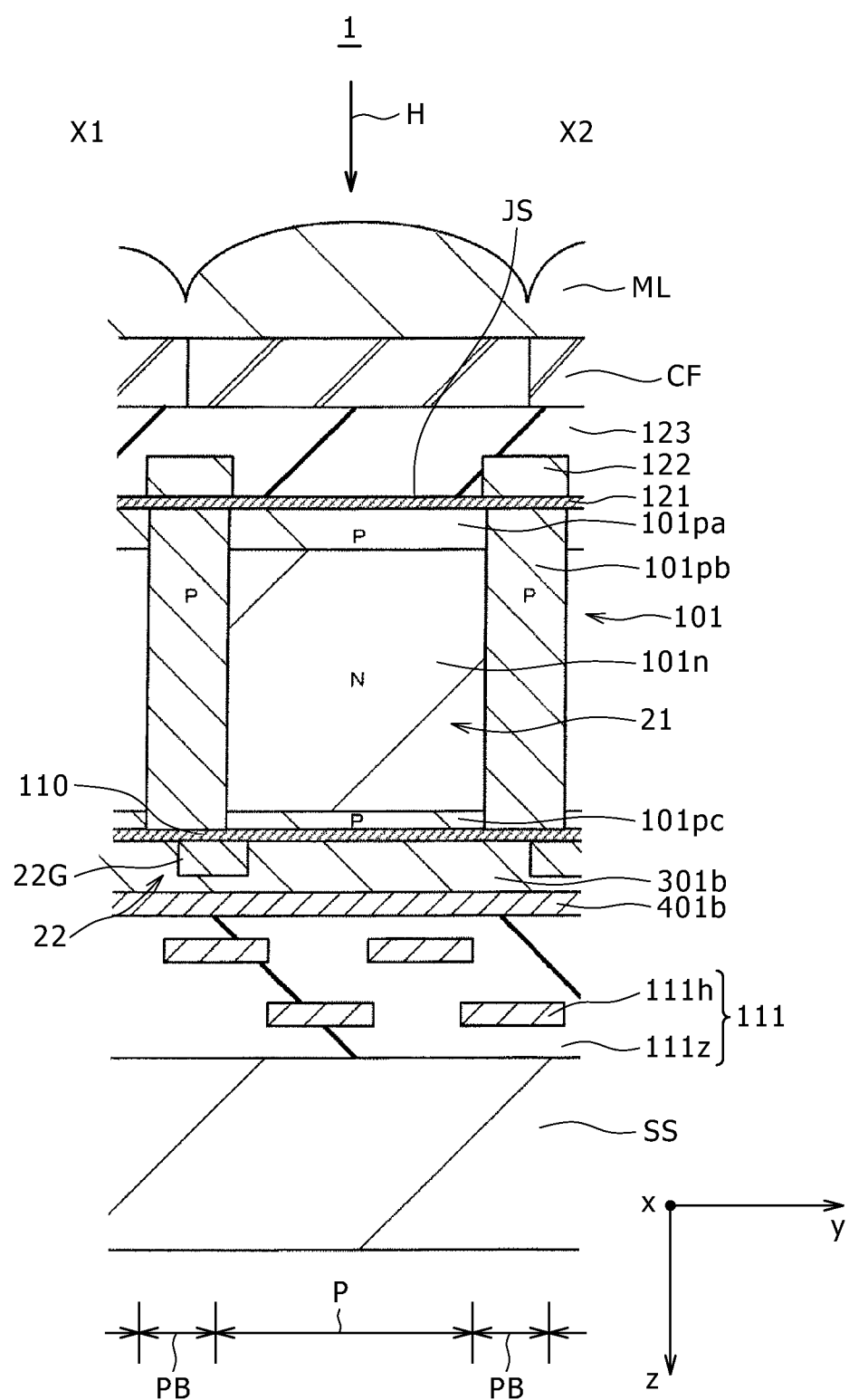
FIG. 11 is a diagram showing principal elements of a solid-state imaging device according to a second embodiment.

Much like FIG. 3, FIG. 11 is a diagram showing a cross section. Much like FIG. 5, on the other hand, FIG. 12 shows a side close to a lower surface shown in FIG. 11 as the front surface of the semiconductor substrate 101 of the solid-state imaging device.

Figure 12:
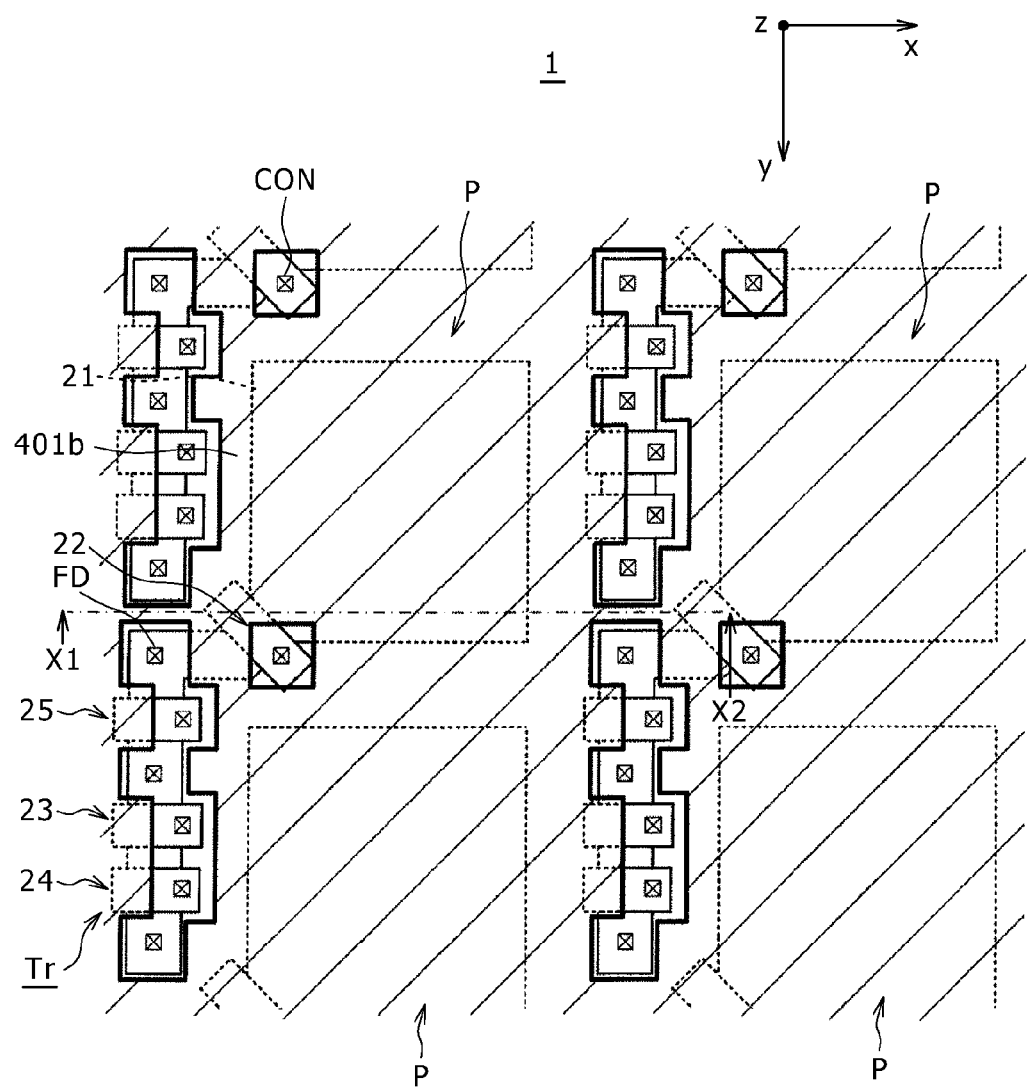
FIG. 12 is a diagram showing principal elements of the solid-state imaging device according to the second embodiment.

To put it in detail, FIG. 11 shows a model representing a cross section of a portion X1-X2 shown in FIG. 12. FIG. 12 shows a lower surface shown in FIG. 11 as the front surface of the semiconductor substrate 101 except a support substrate SS and a wiring layer 111. It is to be noted that, for the sake of drawing convenience, in the figures, the shape (including the width) of each portion may be properly changed from diagram to diagram.

As shown in FIGS. 11 and 12, a light-reflection preventing film 301b and a light absorption layer 401b which are employed in the second embodiment are different from their respective counterparts employed in the first embodiment. Except for these differences and maters related to these differences, the second embodiment is identical with the first one. Thus, explanation of portions common to the first and second embodiments is properly omitted from the following description.

As shown in FIG. 11, the light-reflection preventing film 301b is provided on a lower surface, which is shown in the figure as the front surface of the semiconductor substrate 101, so as to sandwich a gate insulation film 110 between the light-reflection preventing film 301b and the semiconductor substrate 101.

However, the second embodiment is different from the first embodiment shown in some diagrams including FIG. 3 in that, in the case of the second embodiment, the light-reflection preventing film 301b is provided so as to cover the gate electrode 22G of the transfer transistor 22 as shown in FIG. 11. In addition, the light-reflection preventing film 301b is provided so as to flatten a lower surface shown in FIG. 11 as the front surface of the semiconductor substrate 101 in which the gate electrode 22G of the transfer transistor 22 has been created.

That is to say, as shown in FIG. 11, the light-reflection preventing film 301b is created to have a thickness greater than the gate electrode 22G of the transfer transistor 22. For example, on the basis of an equation described earlier, the light-reflection preventing film 301b is created so that the thickness d of the light absorption layer 401b is 300 nm (for m=1) or 500 nm (for m=2).

As shown in FIG. 11, the light absorption layer 401b is created on a lower surface shown in the figure as the front surface of the semiconductor substrate 101 so as to sandwich the gate insulation film 110 and the light-reflection preventing film 301b between the light absorption layer 401b and the semiconductor substrate 101.

In the case of this embodiment, however, as shown in FIG. 11, the light absorption layer 401b is created on a lower surface shown in the figure as the front surface of the light-reflection preventing film 301b so as to cover also the gate electrode 22G of the transfer transistor 22. That is to say, the light absorption layer 401b is provided not on the same layer as the gate electrode 22G.

As shown in FIG. 12, the light absorption layer 401b is created on an entire lower surface shown in FIG. 11 as the front surface of the semiconductor substrate 101 so as to cover a specific portion other than a portion in which the contact CON has been provided. That is to say, the light absorption layer 401b is created so as to cover a lower surface shown in FIG. 11 as the front surface of the semiconductor substrate 101 but provide an aperture on the portion in which the contact CON has been provided. The light absorption layer 401b is provided as a single junction between pixels P lined up in the horizontal direction x and the vertical direction y.

(B) Conclusions

As described above, in the same way as the first embodiment, in the case of the second embodiment, the light absorption layer 401b is provided on a lower surface shown in FIG. 11 as the front surface of the semiconductor substrate 101. Thus, light propagating to the wiring layer 111 through the semiconductor substrate 101 is absorbed by the light absorption layer 401b before the light arrives at the wiring layer 111.

Thus, the second embodiment is capable of preventing the light propagating to the wiring layer 111 through the semiconductor substrate 101 from being reflected by the wires 111h of the wiring layer 111. As a result, the quality of the taken image can be improved.

It is to be noted that the concepts adopted in the first and second modified versions of the first embodiment can be applied to the second embodiment.

3: Others

Implementations of the present disclosure are by no means limited to the first and second embodiments described so far and the first and second modified versions of the first embodiment. That is to say, the first and second embodiments as well as the first and second modified versions of the first embodiment can be further modified in a variety of ways in order to implement the present disclosure.

On top of that, in the embodiments described above, the present disclosure is applied to cameras. However, applications of the present disclosure are by no means limited to cameras. That is to say, the present disclosure can also be applied to other electronic apparatus each employing the solid-state imaging device according to any of the embodiments. Typical examples of the other electronic apparatus include a scanner and a copier.

In addition, in the embodiments described above, the pixel transistor circuit Tr includes four different transistors, i.e., the transfer transistor 22, the amplification transistor 23, the select transistor 24 and the reset transistor 25. However, the pixel transistor circuit Tr is by no means limited to such a configuration. For example, it is also possible to provide a configuration in which the pixel transistor circuit Tr includes three different transistors, i.e., the transfer transistor 22, the amplification transistor 23 and the reset transistor 25.

On top of that, in the embodiments described above, one transfer transistor 22, one amplification transistor 23, one select transistor 24 and one reset transistor 25 are provided for each photodiode 21. However, implementations of the present disclosure are by no means limited to such a configuration. For example, it is also possible to adopt a configuration in which one amplification transistor 23, one select transistor 24 and one reset transistor 25 are provided for each plurality of photo diodes 21.

In addition, the present disclosure can be applied to not only a CMOS image sensor, but also a CCD (Charge-Coupled Device) image sensor.

On top of that, in the embodiments described above, a light-reflection preventing film 301 or 301b is provided. However, implementations of the present disclosure are by no means limited to such a configuration. For example, it is also possible to adopt a configuration in which the light-reflection preventing film 301 or 301b is eliminated.

In addition, the embodiments described above can be combined properly.

That is to say, the present disclosure can be realized into the following implementations.

1: A solid-state imaging device including:

an opto-electrical conversion section provided inside a semiconductor substrate to receive incident light coming from one surface of the semiconductor substrate;

a wiring layer provided on the other surface of the semiconductor substrate; and a light absorption layer provided between the other surface of the semiconductor substrate and the wiring layer to absorb transmitted light passing through the opto-electrical conversion section as part of the incident light.

2: The solid-state imaging device according to implementation 1 wherein a light-reflection preventing layer is provided between the other surface of the semiconductor substrate and the wiring layer.

3: The solid-state imaging device according to implementation 1 or 2 wherein the light absorption layer is created from a material having a light absorption coefficient greater than that of the semiconductor substrate.

4: The solid-state imaging device according to implementation 1 or 2 wherein:
the semiconductor substrate is created from single-crystal silicon; and
the light absorption layer is created from amorphous silicon.

5: The solid-state imaging device according to implementation 1 or 2 wherein:
the semiconductor substrate is created from single-crystal silicon; and
the light absorption layer is created from amorphous silicon doped with germanium.

6: The solid-state imaging device according to implementation 1 or 2 wherein:
the semiconductor substrate is created from single-crystal silicon; and
the light absorption layer is created from microcrystal silicon.

7: The solid-state imaging device according to implementation 1 or 2 wherein a voltage is applied to the light absorption layer in order to prevent a dark current from being generated on the other surface of the semiconductor substrate.

8: The solid-state imaging device according to any one of implementations 1 to 6, the solid-state imaging device further having a pixel transistor circuit provided on the other surface of the semiconductor substrate to output signal electric charge, which is generated by the opto-electrical conversion section, as an electrical signal, wherein the wiring layer is provided on the other surface of the semiconductor substrate to sandwich the pixel transistor circuit between the wiring layer and the other surface of the semiconductor substrate.

9: A method for manufacturing a solid-state imaging device including:
providing an opto-electrical conversion section inside a semiconductor substrate to serve as a section for receiving incident light coming from one surface of the semiconductor substrate;
providing a light absorption layer on the other surface of the semiconductor substrate to serve as a layer for absorbing transmitted light passing through the opto-electrical conversion section as part of the incident light; and
providing a wiring layer so as to cover the other surface pertaining to the semiconductor substrate to serve as a surface on which the light absorption layer has been provided.

10: An electronic apparatus including:
an opto-electrical conversion section provided inside a semiconductor substrate to receive incident light coming from one surface of the semiconductor substrate;
a wiring layer provided on the other surface of the semiconductor substrate; and
a light absorption layer provided between the other surface of the semiconductor substrate and the wiring layer to absorb transmitted light passing through the opto-electrical conversion section as part of the incident light.

It is to be noted that, in the embodiments described above, the photodiode 21 is a typical opto-electrical conversion section whereas the camera 40 is a typical electronic apparatus.

The present application contains subject matter related to that disclosed in Japanese Priority Patent Application JP 2011-067076 filed in the Japan Patent Office on Mar. 25, 2011, the entire content of which is hereby incorporated by reference.

What is claimed is:
1. A solid-state imaging device comprising:
an opto-electrical conversion section provided inside a semiconductor substrate to receive incident light coming from one surface of said semiconductor substrate;
a wiring layer provided on another surface of said semiconductor substrate; and
a light absorption layer provided between said another surface of said semiconductor substrate and said wiring layer to absorb transmitted light passing through said opto-electrical conversion section as part of said incident light,
wherein said semiconductor substrate is created from single crystal silicon, and
wherein said light absorption layer is created from at least one material selected from the group consisting of amorphous silicon, microcrystal silicon, and amorphous silicon doped with germanium.

2. The solid-state imaging device according to claim 1 wherein a light-reflection preventing layer is provided between said another surface of said semiconductor substrate and said wiring layer.

3. The solid-state imaging device according to claim 1 wherein said light absorption layer is created from a material having a light absorption coefficient greater than that of said semiconductor substrate.

4. The solid-state imaging device according to claim 1 wherein:
said light absorption layer is created from amorphous silicon.

5. The solid-state imaging device according to claim 1 wherein:
said light absorption layer is created from amorphous silicon doped with germanium.

6. The solid-state imaging device according to claim 1 wherein:
said light absorption layer is created from microcrystal silicon.

7. The solid-state imaging device according to claim 1 wherein a voltage is applied to said light absorption layer in order to prevent a dark current from being generated on said another surface of said semiconductor substrate.

8. The solid-state imaging device according to claim 1, said solid-state imaging device further comprising a pixel transistor circuit provided on said another surface of said semiconductor substrate to output signal electric charge, which is generated by said opto-electrical conversion section, as an electrical signal, wherein said wiring layer is provided on said another surface of said semiconductor substrate to sandwich said pixel transistor circuit between said wiring layer and said another surface of said semiconductor substrate.

9. A method for manufacturing a solid-state imaging device comprising:
providing an opto-electrical conversion section inside a semiconductor substrate to serve as a section for receiving incident light coming from one surface of said semiconductor substrate;
providing a light absorption layer on said another surface of said semiconductor substrate to serve as a layer for absorbing transmitted light passing through said opto-electrical conversion section as part of said incident light; and
a wiring layer so as to cover said another surface pertaining to said semiconductor substrate to serve as a surface on which said light absorption layer has been provided,
wherein said semiconductor substrate created from single crystal silicon, and wherein said light absorption layer is created from at least one material selected from the group consisting of amorphous silicon, microcrystal silicon, and amorphous silicon doped with germanium.

10. An electronic apparatus comprising:
an opto-electrical conversion section provided inside a semiconductor substrate to receive incident light coming from one surface of said semiconductor substrate;
a wiring layer provided on the other surface of said semiconductor substrate; and
a light absorption layer provided between said another surface of said semiconductor substrate and said wiring layer to absorb transmitted light passing through said opto-electrical conversion section as part of said incident light,
wherein said semiconductor substrate is created from single crystal silicon, and
wherein said light absorption layer is created from at least one material selected from the group consisting of amorphous silicon, microcrystal silicon, and amorphous silicon doped with germanium.

\* \* \* \* \*